(12) United States Patent
Giagnocavo

(10) Patent No.: US 12,034,387 B2
(45) Date of Patent: Jul. 9, 2024

(54) FLEXIBLE PRINTED CIRCUIT BOARD (PCB)-BASED MOBILE SENSOR PLATFORM

(71) Applicant: CenturyLink Intellectual Property LLC, Broomfield, CO (US)

(72) Inventor: Patrick Giagnocavo, Littleton, CO (US)

(73) Assignee: CenturyLink Intellectual Property LLC, Denver, CO (US)

( * ) Notice: Subject to any disclaimer, the term of this patent is extended or adjusted under 35 U.S.C. 154(b) by 236 days.

(21) Appl. No.: 17/882,913

(22) Filed: Aug. 8, 2022

(65) Prior Publication Data

US 2023/0412095 A1 Dec. 21, 2023

Related U.S. Application Data

(60) Provisional application No. 63/352,946, filed on Jun. 16, 2022.

(51) Int. Cl.
*H02N 2/04* (2006.01)
*H05K 1/18* (2006.01)
*H10N 35/00* (2023.01)

(52) U.S. Cl.
CPC ............. *H02N 2/04* (2013.01); *H05K 1/189* (2013.01); *H10N 35/00* (2023.02); *H05K 2201/083* (2013.01); *H05K 2201/10037* (2013.01); *H05K 2201/10106* (2013.01); *H05K 2201/10121* (2013.01); *H05K 2201/10151* (2013.01)

(58) Field of Classification Search
CPC .......... H02N 2/04; H10N 35/00; H05K 1/189; H05K 2201/083; H05K 2201/10037; H05K 2201/10106; H05K 2201/10121; H05K 2201/10151
See application file for complete search history.

(56) References Cited

U.S. PATENT DOCUMENTS

| | | | |
|---|---|---|---|
| 2012/0195008 A1* | 8/2012 | McClure .............. | H05K 1/0281 174/254 |
| 2013/0069639 A1* | 3/2013 | Cobb ..................... | G01R 33/18 29/829 |
| 2021/0267065 A1* | 8/2021 | Florendo .................. | H01F 7/06 |

* cited by examiner

*Primary Examiner* — Jue Zhang

(57) ABSTRACT

Novel tools and techniques are provided for implementing flexible printed circuit board ("PCB")-based mobile sensor platform. In various embodiments, a flexible PCB-based mobile sensor platform includes a body portion(s) and at least one of a microcontroller, a locomotion system, sensors, a transceiver(s), and/or the like, each disposed on the body portion(s). The locomotion system includes one or more flexible PCB portions and corresponding actuators. Based on instructions from the microcontroller, at least one actuator may cause bending and unbending of a corresponding flexible PCB portion(s) that causes the flexible PCB-based mobile sensor platform to move toward a target location within a first environment. Upon arrival, the sensors may collect sensor data regarding at least one of the target location, an object located at the target location, or a portion of the object, and the microcontroller may send the collected sensor data to an external device via the transceiver.

20 Claims, 15 Drawing Sheets

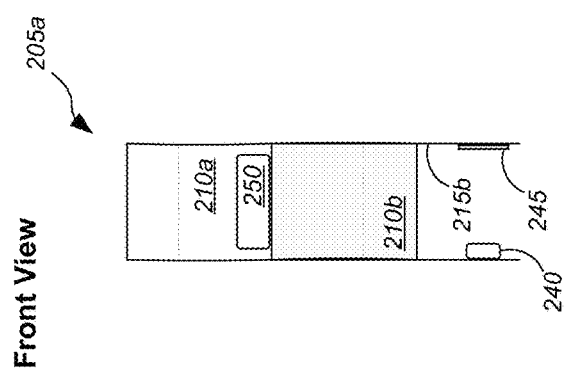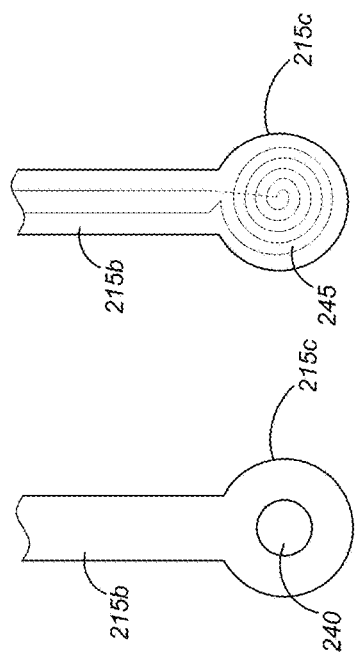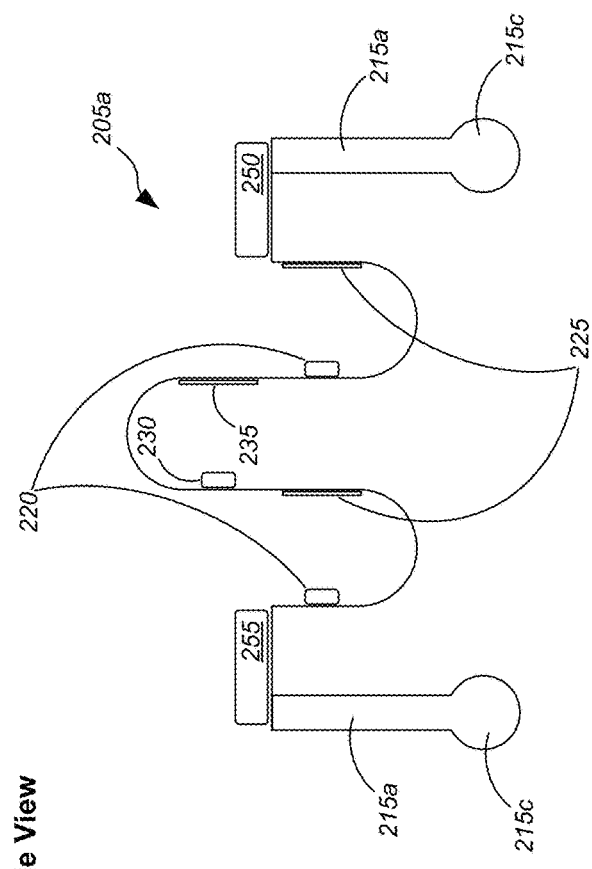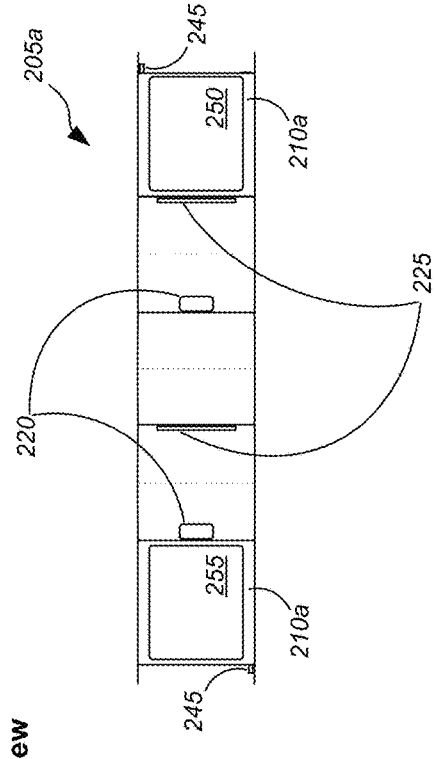

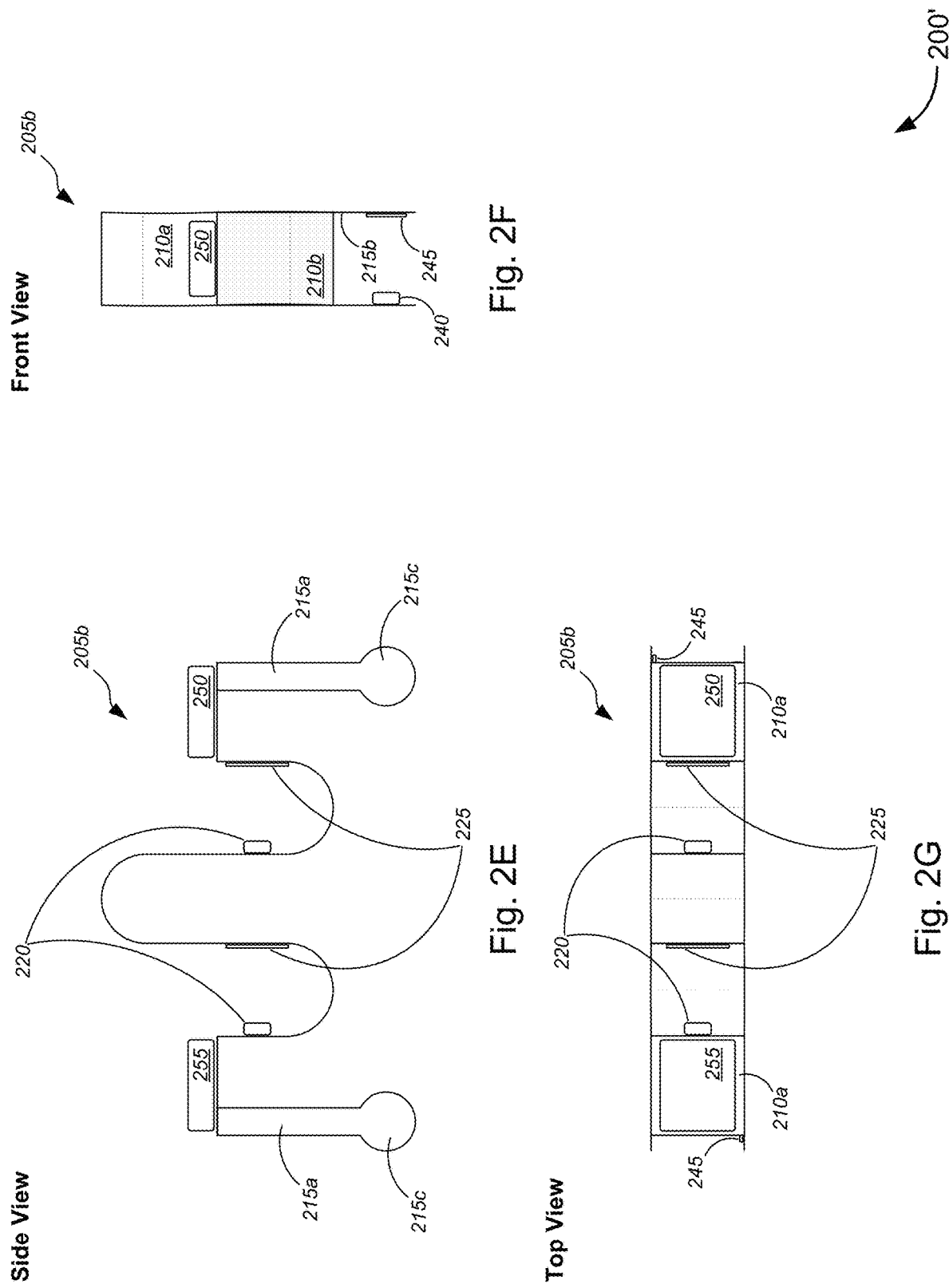

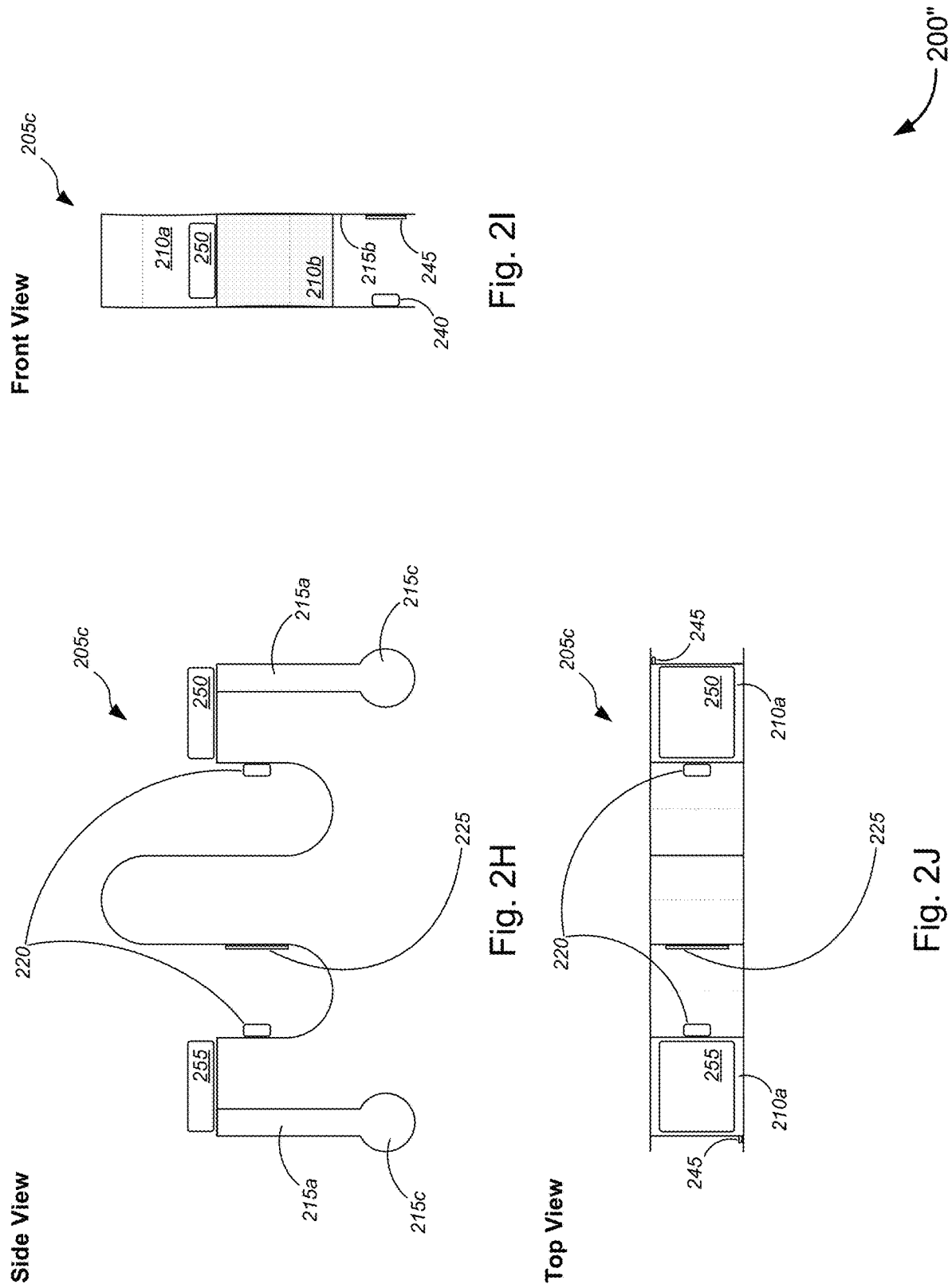

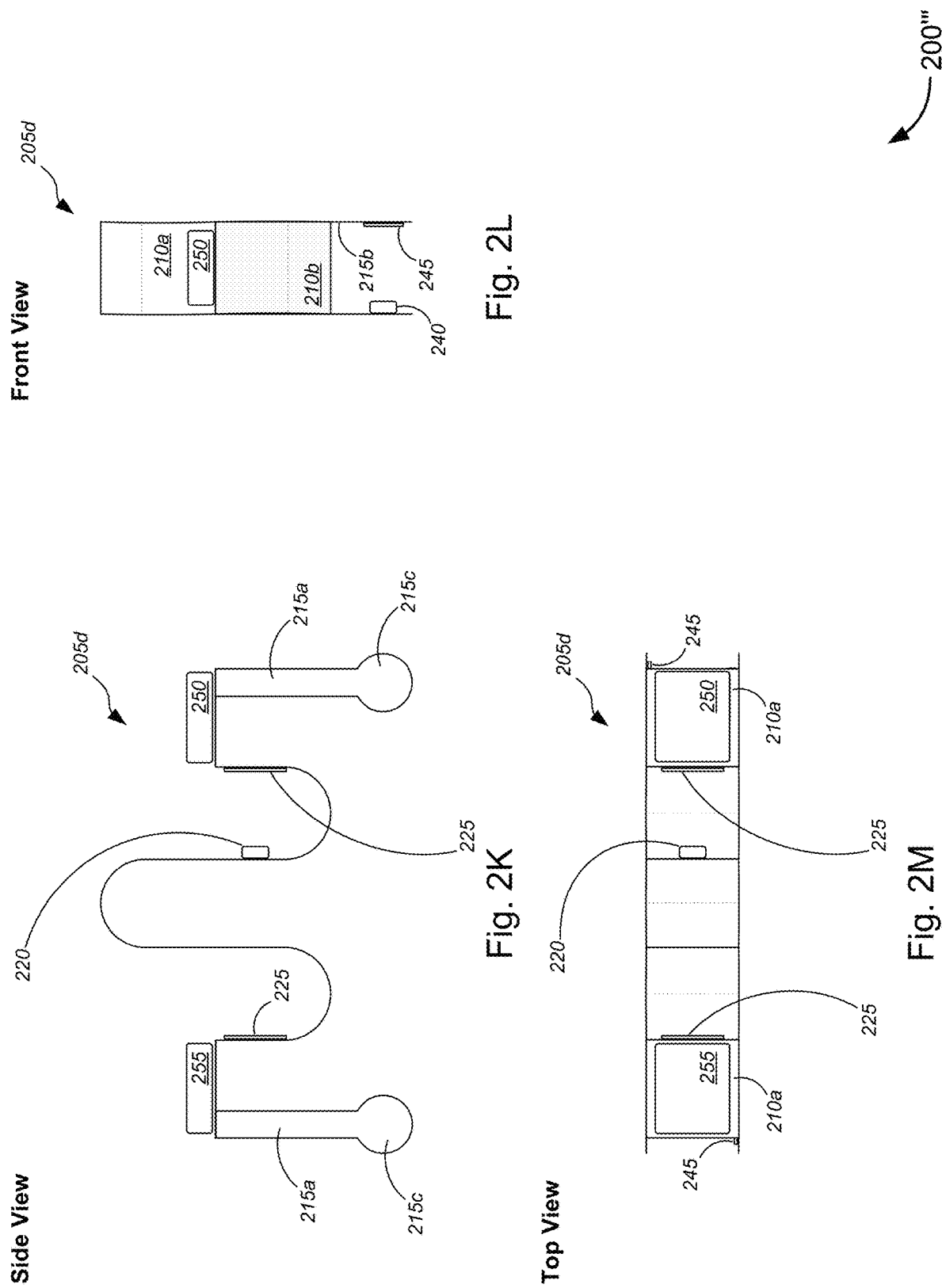

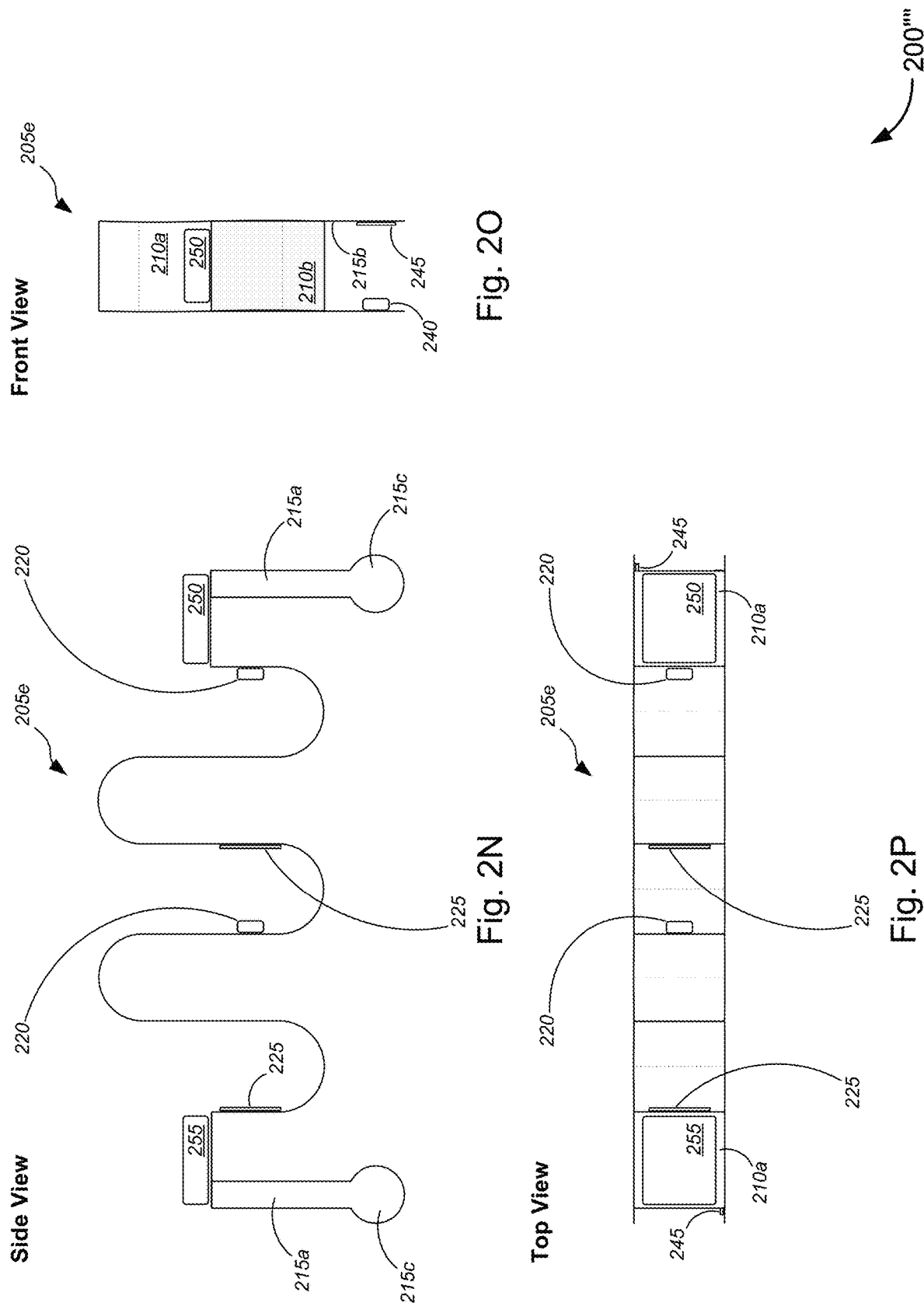

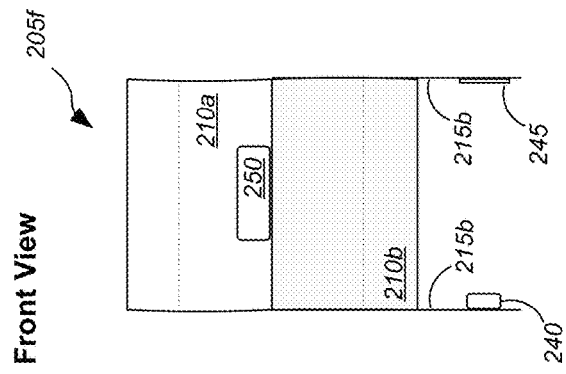
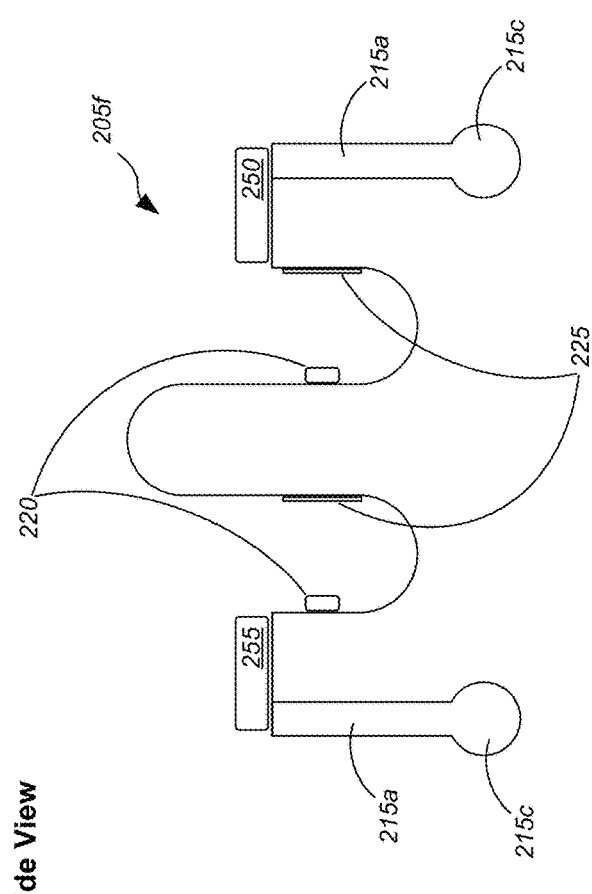
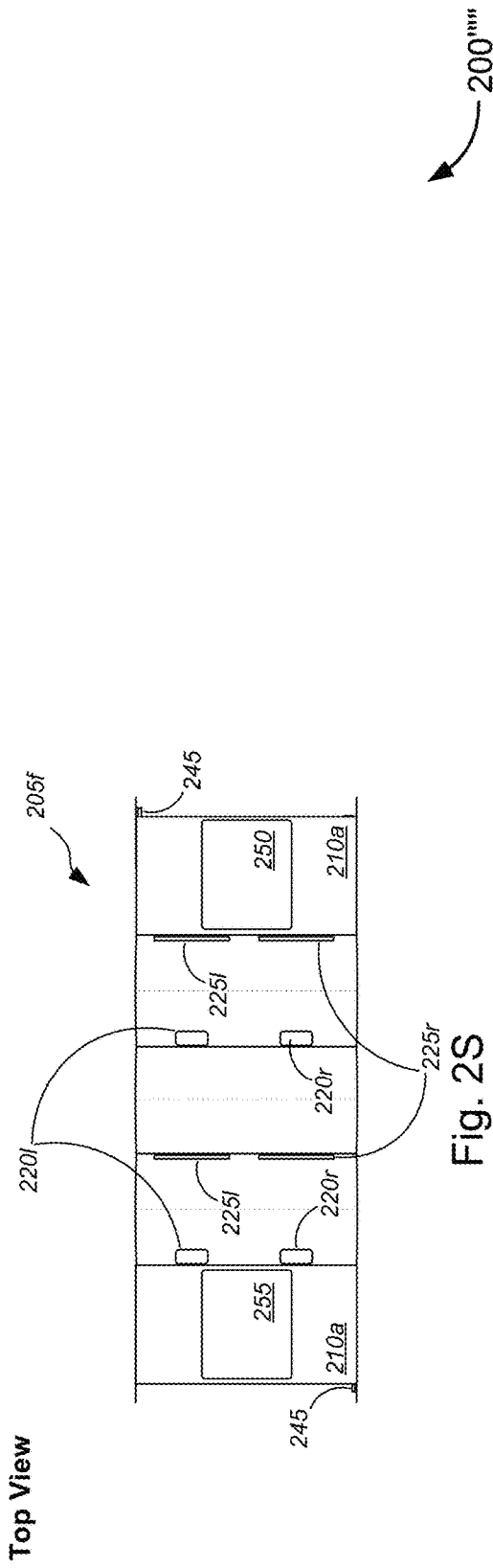

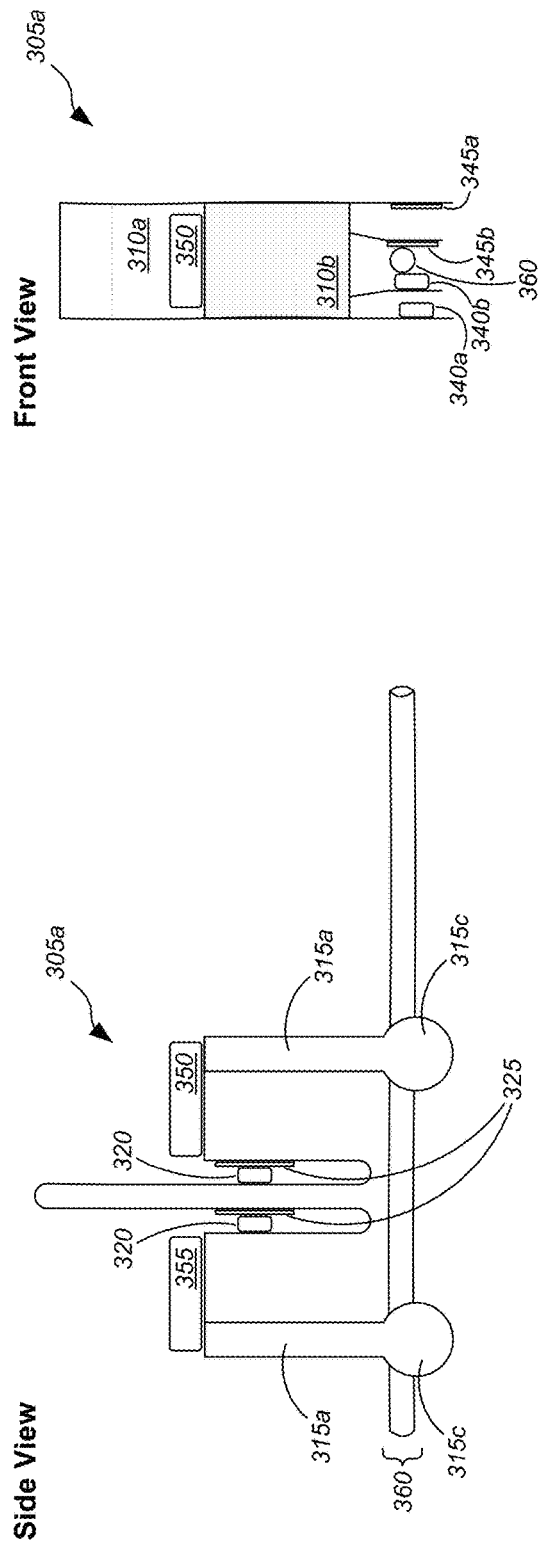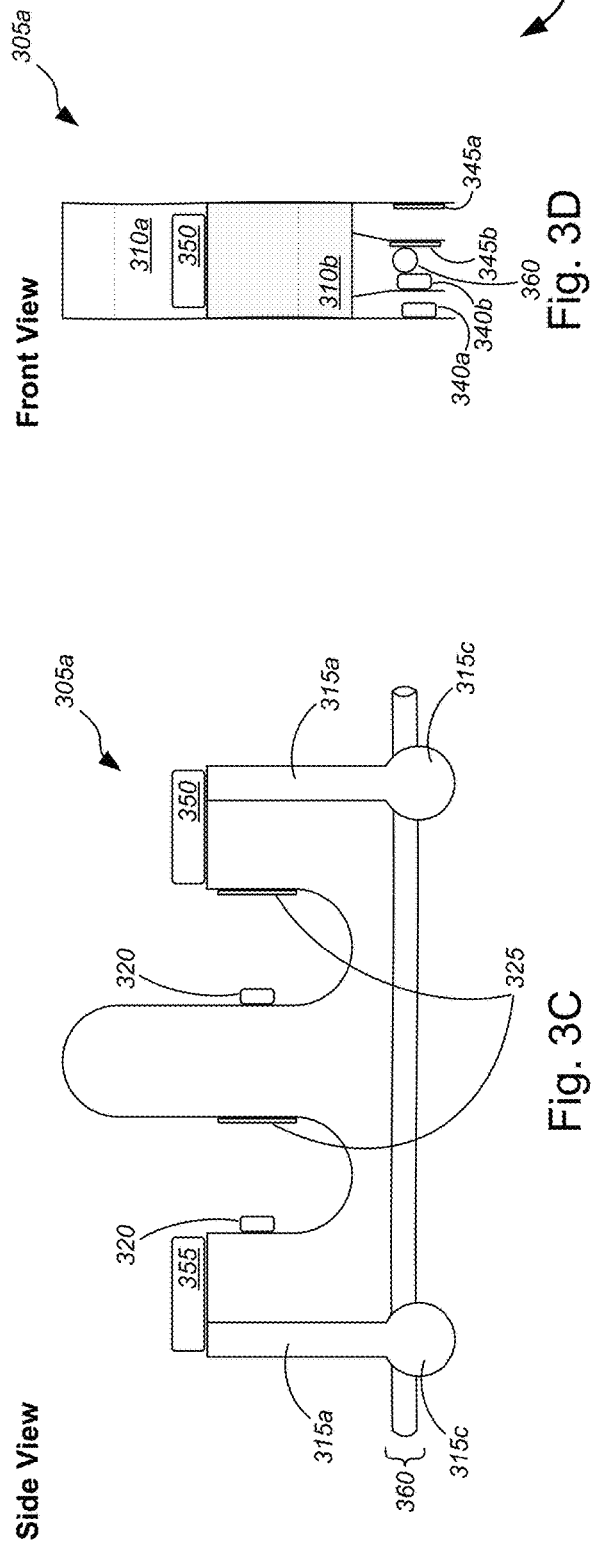

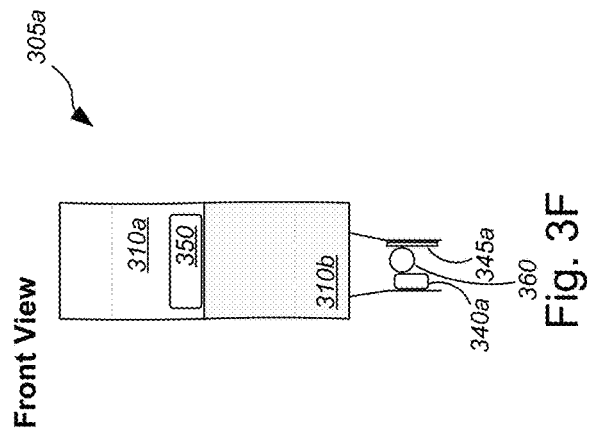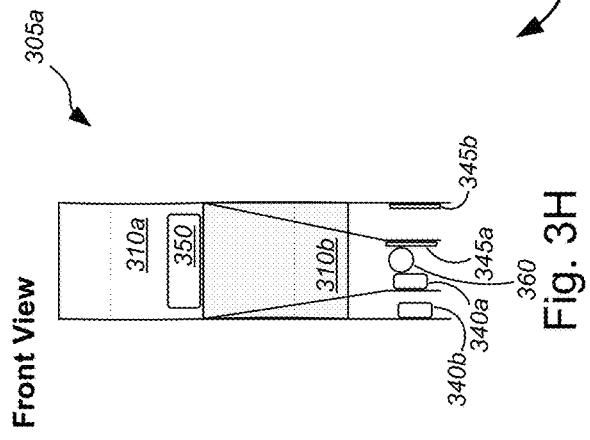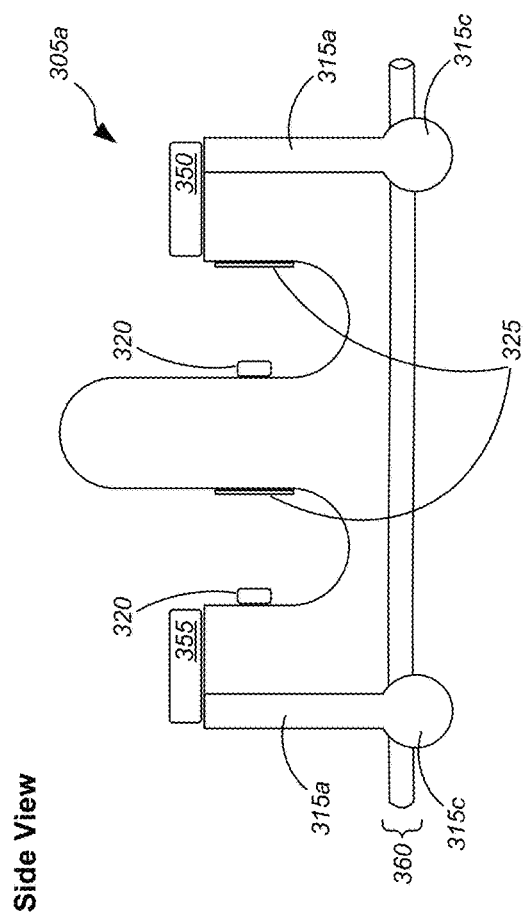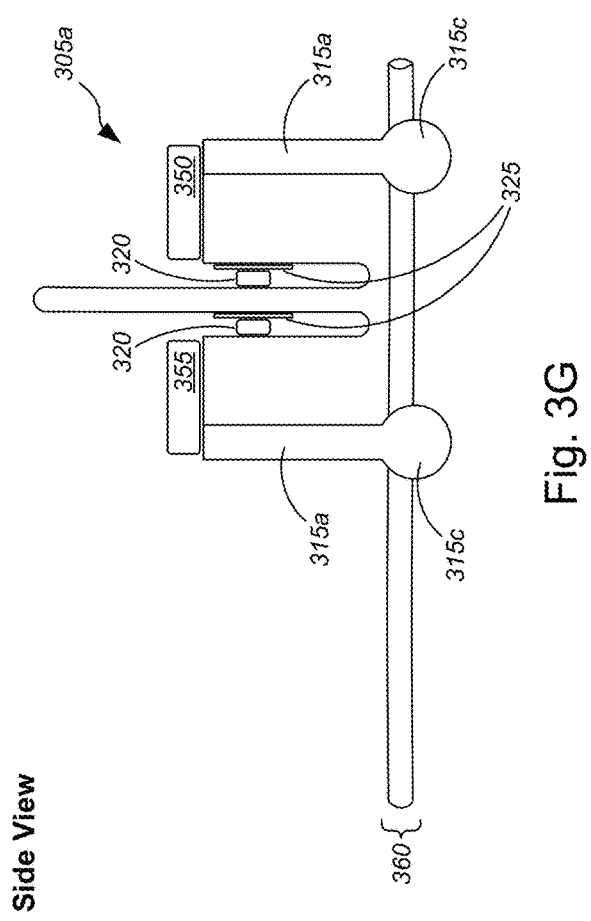

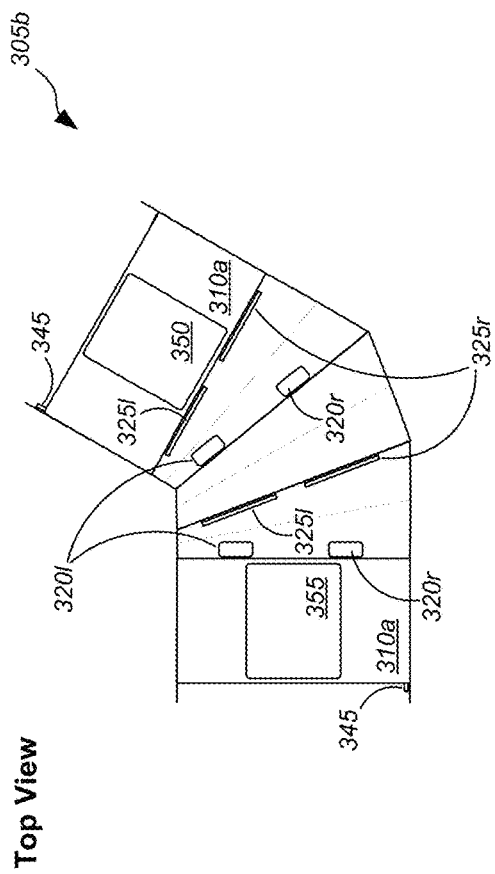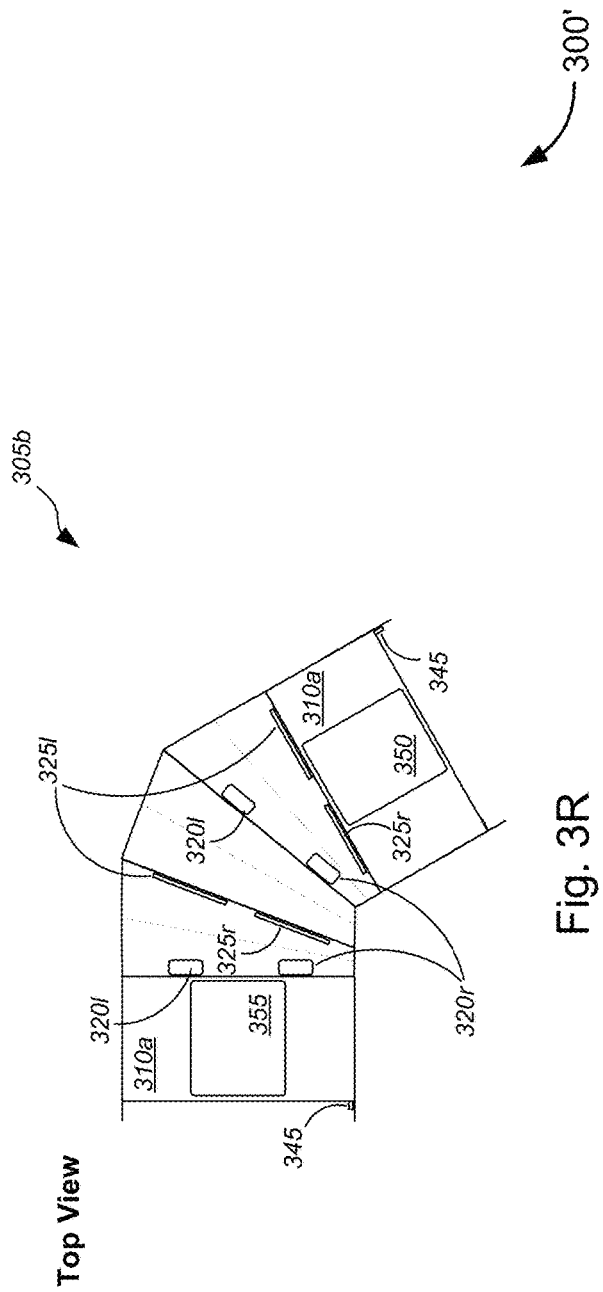

FLEXIBLE PRINTED CIRCUIT BOARD (PCB)-BASED MOBILE SENSOR PLATFORM

CROSS-REFERENCES TO RELATED APPLICATIONS

This application claims priority to U.S. Patent Application Ser. No. 63/352,946 (the "'946 application"), filed Jun. 16, 2022, by Patrick Giagnocavo, entitled, "Flexible Printed Circuit Board (PCB)-Based Mobile Sensor Platform," the disclosure of which is incorporated herein by reference in its entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for implementing miniature robotic machines, and, more particularly, to methods, systems, and apparatuses for implementing flexible printed circuit board ("PCB")-based mobile sensor platform.

BACKGROUND

In small, hard-to-reach, hard-to-access, and/or hazardous locations or structures, there is a need to inspect, monitor, diagnose, repair, and/or clean objects located in such areas. Conventional systems and devices, however, are either too bulky, too expensive, and/or otherwise unsuitable for performing such tasks in such areas.

Hence, there is a need for more robust and scalable solutions for implementing miniature robotic machines, and, more particularly, to methods, systems, and apparatuses for implementing flexible PCB-based mobile sensor platform.

SUMMARY

The techniques of this disclosure generally relate to tools and techniques for implementing miniature robotic machines, and, more particularly, to methods, systems, and apparatuses for implementing flexible printed circuit board ("PCB")-based mobile sensor platform.

In an aspect, a flexible printed circuit board ("PCB")-based mobile sensor platform may comprise: at least one body portion; a microcontroller disposed on the at least one body portion; one or more sensors disposed on the at least one body portion and configured to collect sensor data; a transceiver disposed on the at least one body portion, the transceiver being configured to receive wireless instructions for the microcontroller to execute and being configured to send the collected sensor data to an external device; a locomotion system comprising one or more flexible PCB portions and corresponding one or more actuators, each actuator among the one or more actuators communicatively coupled to the microcontroller and configured to cause a corresponding flexible PCB portion among the one or more flexible PCB portions to bend and unbend. In response to receiving instructions from the microcontroller, at least one actuator among the one or more actuators may cause bending and unbending of corresponding at least one flexible PCB portion among the one or more flexible PCB portions that causes the flexible PCB-based mobile sensor platform to move toward a target location within a first environment, by moving along at least one first direction. In response to determining that the flexible PCB-based mobile sensor platform has arrived at the target location, the one or more sensors may collect sensor data regarding at least one of the target location, an object located at the target location, or a portion of the object, and the microcontroller sends the collected sensor data to the external device via the transceiver.

In some embodiments, the flexible PCB portion may be made of a material comprising at least one of polyimide, polyester, polyethylene terephthalate ("PET"), or polyethylene naphthalate ("PEN"), and/or the like. In some instances, the at least one body portion may be made of the same material as the flexible PCB portion. In some cases, the one or more sensors may comprise at least one of one or more cameras, one or more ultraviolet ("UV") light sensors, one or more infrared ("IR") light sensors, one or more radio frequency ("rf") sensors, one or more miniature cameras, one or more miniature UV light sensors, one or more miniature IR light sensors, one or more miniature rf sensors, one or more gas sensors, one or more air quality sensors, one or more motion sensors, one or more sound sensors, or one or more signal detectors, and/or the like. In some instances, the external device may comprise at least one of a smart phone, a mobile phone, a tablet computer, a laptop computer, a desktop computer, a server computer, a wireless access point, a wireless data relay device, a wireless data hub, or a data collection system, and/or the like.

According to some embodiments, the flexible PCB-based mobile sensor platform may further comprise at least one power source, the at least one power source comprising at least one of a wired connection to an external power supply, a battery, a wireless induction-based power source, a solar power-based power source, a mechanical energy storage power source, a spring-based mechanical energy storage power source, a piezo-electric-based energy storage power source, or an energy scavenging circuit-based power source, and/or the like.

In some embodiments, the one or more flexible PCB portions may comprise at least one flexible PCB portion that is folded with at least one fold such that a first portion of a first surface faces a second portion of the first surface. In some instances, the one or more actuators may comprise at least one actuator disposed on at least one of the first portion or the second portion of the first surface. In some cases, actuation of the at least one actuator may cause the switch between one of two states, the two states comprising an attraction state between the first and second portions and a repulsion state between the first and second portions. In some instances, switching between the attraction state and the repulsion state in a preconfigured mode may cause the flexible PCB-based mobile sensor platform to move toward the target location.

According to some embodiments, the at least one actuator may comprise a magnetic material that is disposed on one of the first portion or the second portion and a spiral PCB coil that is printed on the other of the first portion or the second portion. In some cases, the attraction state may be implemented by energizing the spiral PCB coil in a first current direction causing a magnetic field-based attraction between the spiral PCB coil and the magnetic material, thereby resulting in the first and second portions moving toward each other. In a similar manner, the repulsion state may be implemented by energizing the spiral PCB coil in a second current direction that is opposite to the first current direction causing a magnetic field-based repulsion between the spiral PCB coil and the magnetic material, thereby resulting in the first and second portions moving away from each other.

In some instances, the at least one flexible PCB portion may be folded with a plurality of folds such that the first portion of the first surface faces the second portion of the first surface and a third portion of the first surface faces a fourth portion of the first surface. In some cases, the at least one actuator may comprise a first magnetic material that is disposed on one of the first portion or the second portion, a first spiral PCB coil that is printed on the other of the first portion or the second portion, a second magnetic material that is disposed on one of the third portion or the fourth portion, and a second spiral PCB coil that is printed on the other of the third portion or the fourth portion. In some instances, the attraction state may be implemented by energizing each spiral PCB coil in the first current direction causing a magnetic field-based attraction between each spiral PCB coil and each corresponding magnetic material, thereby resulting in the first and second portions moving toward each other and in the third and fourth portions moving toward each other. In a similar manner, the repulsion state may be implemented by energizing each spiral PCB coil in the second current direction that is opposite to the first current direction causing a magnetic field-based repulsion between each spiral PCB coil and each magnetic material, thereby resulting in the first and second portions moving away from each other and in the third and fourth portions moving away from each other.

Alternatively, the at least one flexible PCB portion may be folded with a plurality of folds such that the first portion of the first surface faces the second portion of the first surface and a third portion of the first surface faces a fourth portion of the first surface. In some cases, the at least one actuator may comprise a first magnetic material that is disposed on the first portion, a first spiral PCB coil that is printed on one of the second portion or the third portion, and a second magnetic material that is disposed on the fourth portion. In some instances, the attraction state may be implemented by energizing the first spiral PCB coil in the first current direction causing a magnetic field-based attraction between the first spiral PCB coil and each of the first and second magnetic materials, thereby resulting in the first and fourth portions moving toward the one of the second portion or the third portion. In a similar manner, the repulsion state may be implemented by energizing the first spiral PCB coil in the second current direction that is opposite to the first current direction causing a magnetic field-based repulsion between the first spiral PCB coil and each of the first and second magnetic materials, thereby resulting in the first and fourth portions moving away from the one of the second portion or the third portion.

Alternatively, the at least one flexible PCB portion may be folded with a plurality of folds such that the first portion of the first surface faces the second portion of the first surface and a third portion of the first surface faces a fourth portion of the first surface. In some instances, the at least one actuator may comprise a first spiral PCB coil that is printed on the first portion, a first magnetic material that is disposed on one of the second portion or the third portion, a second spiral PCB coil that is printed on the fourth portion. In some cases, the attraction state may be implemented by energizing each spiral PCB coil in the first current direction causing a magnetic field-based attraction between each spiral PCB coil and the first magnetic material, thereby resulting in the first and fourth portions moving toward the one of the second portion or the third portion. In a similar manner, the repulsion state may be implemented by energizing each spiral PCB coil in the second current direction that is opposite to the first current direction causing a magnetic field-based repulsion between each spiral PCB coil and the first magnetic material, thereby resulting in the first and fourth portions moving away from the one of the second portion or the third portion.

In some cases, each of the first and second portions of the first surface may comprise a pair of side-by-side actuators that is configured to independently actuate to cause the flexible PCB-based mobile sensor platform to turn to a right-side or a left-side based on differential attraction or repulsion of the side-by-side actuators.

In some embodiments, the at least one target location may comprise at least one portion of an optical fiber cable. In such cases, the flexible PCB-based mobile sensor platform may further comprise: a pair of flexible PCB front leg portions and a pair of flexible PCB rear leg portions, each pair extending from either side of the at least one body portion, each leg portion comprising a foot portion that is made of a material that is soft or deformable and that provides traction against an outer cladding of the optical fiber cable; a first set of lateral actuators disposed on the pair of flexible PCB front leg portions that, when actuated, are configured to switch between an attraction state between the front leg portions and a repulsion state between the front leg portions; a second set of lateral actuators disposed on the pair of flexible PCB rear leg portions that, when actuated, are configured to switch between an attraction state between the rear leg portions and a repulsion state between the rear leg portions. In some cases, actuation of the first and second sets of lateral actuators may be coordinated with actuation of the at least one actuator of the locomotion system, such that forward motion of the flexible PCB-based mobile sensor platform may be achieved by repeating the following sequence: the second set of lateral actuators being set to the attraction state such that the foot portions of the pair of flexible PCB rear leg portions are in contact with the optical fiber cable; the first set of lateral actuators being set to the repulsion state; the at least one actuator of the locomotion system causing unbending of the corresponding at least one flexible PCB portion, resulting in the pair of flexible PCB front leg portions moving forward along the optical fiber cable relative to the pair of flexible PCB rear leg portions; the first set of lateral actuators being set to the attraction state such that the foot portions of the pair of flexible PCB front leg portions are set to contact with the optical fiber cable; the second set of lateral actuators being set to the repulsion state; and the at least one actuator of the locomotion system causing bending of corresponding flexible PCB portions, resulting in the pair of flexible PCB rear leg portions moving forward along the optical fiber cable relative to the pair of flexible PCB front leg portions.

In some instances, the target location may comprise one of a damaged portion of the optical fiber cable, a portion of the optical fiber cable with at least one exposed cladding layer, or a fiber optic connector disposed at an end of the optical fiber cable, and/or the like. In some cases, the one or more sensors may collect sensor data regarding at least one of the target location, state of the optical fiber cable, state of the fiber optic connector, or optical characteristics of the optical fiber cable, and/or the like. In some instances, the flexible PCB-based mobile sensor platform may further comprise one or more light emitting diode ("LED") indicator lights communicatively coupled to the microcontroller. The one or more LED indicator lights may be indicative of one or more of a functioning optical fiber cable, a damaged optical fiber cable, or a damaged fiber optic connector, and/or the like. In some cases, the flexible PCB-based mobile sensor platform may further comprise a cleaning surface extending from the at least one body portion, the cleaning surface being configured to drag along, and being configured to clean, the at least one portion of the optical fiber cable as the flexible PCB-based mobile sensor platform is moved along the optical fiber cable.

According to some embodiments, the first environment may comprise one of an agricultural location, a mining location, a hazardous location, a rubble-strewn search and rescue location, or a confined duct or piping, and/or the like. In such cases, the flexible PCB-based mobile sensor platform may further comprise: a pair of flexible PCB front leg portions and a pair of flexible PCB rear leg portions, each pair extending from either side of the at least one body portion, each leg portion comprising a foot portion that is made of a material that provides traction against one or more surfaces in the first environment. In some cases, forward motion of the flexible PCB-based mobile sensor platform may be achieved by repeating the following sequence: the at least one actuator of the locomotion system causing unbending of the corresponding at least one flexible PCB portion, resulting in the pair of flexible PCB front leg portions moving forward along at least one surface in the first environment relative to the pair of flexible PCB rear leg portions; and the at least one actuator of the locomotion system causing bending of corresponding flexible PCB portions, resulting in the pair of flexible PCB rear leg portions moving forward along the at least one surface in the first environment relative to the pair of flexible PCB front leg portions.

In some embodiments, backward motion of the flexible PCB-based mobile sensor platform may be achieved by repeating the following sequence: the at least one actuator of the locomotion system causing unbending of the corresponding at least one flexible PCB portion, resulting in the pair of flexible PCB rear leg portions moving backward along the at least one surface in the first environment relative to the pair of flexible PCB front leg portions; and the at least one actuator of the locomotion system causing bending of corresponding flexible PCB portions, resulting in the pair of flexible PCB front leg portions moving backward along the at least one surface in the first environment relative to the pair of flexible PCB rear leg portions.

In another aspect, a method may be provided for controlling operation of a flexible printed circuit board ("PCB")-based mobile sensor platform. In such cases, the flexible PCB-based mobile sensor platform may comprise at least one body portion, a microcontroller disposed on the at least one body portion, one or more sensors disposed on the at least one body portion and configured to collect sensor data, a transceiver disposed on the at least one body portion, the transceiver being configured to receive wireless instructions for the microcontroller to execute and being configured to send the collected sensor data to an external device, and a locomotion system comprising one or more flexible PCB portions and corresponding one or more actuators, each actuator among the one or more actuators communicatively coupled to the microcontroller and configured to cause a corresponding flexible PCB portion among the one or more flexible PCB portions to bend and unbend. In such cases, the method may comprise: sending, using the microcontroller, instructions to at least one actuator among the one or more actuators; in response to receiving the instructions, causing, using the at least one actuator, bending and unbending of corresponding at least one flexible PCB portion among the one or more flexible PCB portions that causes the flexible PCB-based mobile sensor platform to move toward a target location within a first environment, by moving along at least one first direction; and in response to determining that the flexible PCB-based mobile sensor platform has arrived at the target location, collecting, using the one or more sensors, sensor data regarding at least one of the target location, an object located at the target location, or a portion of the object, and sending, using the microcontroller, the collected sensor data to the external device via the transceiver.

In some embodiments, the flexible PCB-based mobile sensor platform may further comprise a pair of flexible PCB front leg portions and a pair of flexible PCB rear leg portions, each pair extending from either side of the at least one body portion, each leg portion comprising a foot portion that may be made of a material that provides traction against one or more surfaces in the first environment. In some cases, forward motion of the flexible PCB-based mobile sensor platform may be achieved by repeating the following sequence: causing, using the at least one actuator of the locomotion system, unbending of the corresponding at least one flexible PCB portion, resulting in the pair of flexible PCB front leg portions moving forward along at least one surface in the first environment relative to the pair of flexible PCB rear leg portions; and causing, using the at least one actuator of the locomotion system, bending of corresponding flexible PCB portions, resulting in the pair of flexible PCB rear leg portions moving forward along the at least one surface in the first environment relative to the pair of flexible PCB front leg portions. In some instances, backward motion of the flexible PCB-based mobile sensor platform may be achieved by repeating the following sequence: causing, using the at least one actuator of the locomotion system, unbending of the corresponding at least one flexible PCB portion, resulting in the pair of flexible PCB rear leg portions moving backward along the at least one surface in the first environment relative to the pair of flexible PCB front leg portions; and causing, using the at least one actuator of the locomotion system, bending of corresponding flexible PCB portions, resulting in the pair of flexible PCB front leg portions moving backward along the at least one surface in the first environment relative to the pair of flexible PCB rear leg portions.

According to some embodiments, each of first and second portions of the first surface may comprise a pair of side-by-side actuators that may be configured to independently actuate to cause the flexible PCB-based mobile sensor platform to turn to a right-side or a left-side based on differential attraction or repulsion of the side-by-side actuators.

Various modifications and additions can be made to the embodiments discussed without departing from the scope of the invention. For example, while the embodiments described above refer to particular features, the scope of this invention also includes embodiments having different combination of features and embodiments that do not include all of the above-described features.

The details of one or more aspects of the disclosure are set forth in the accompanying drawings and the description below. Other features, objects, and advantages of the techniques described in this disclosure will be apparent from the description and drawings, and from the claims.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

FIGS. 2A-2S are schematic diagrams illustrating various non-limiting examples of a flexible PCB-based mobile sensor platform, in accordance with various embodiments.

DETAILED DESCRIPTION

Overview

Figure 1:
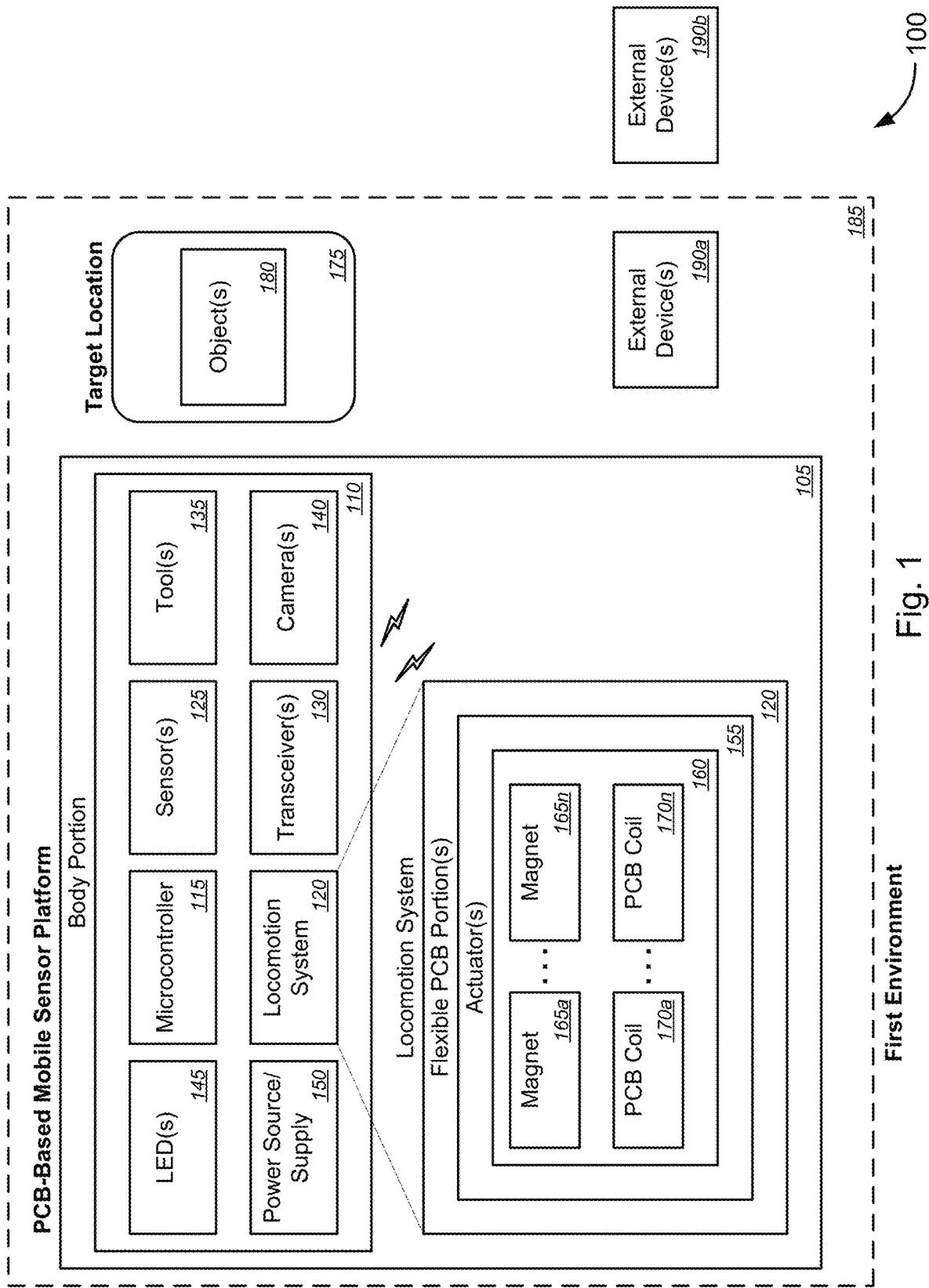
FIG. 1 is a schematic diagram illustrating a system for implementing a flexible printed circuit board ("PCB")-based mobile sensor platform, in accordance with various embodiments.

Various embodiments provide tools and techniques for implementing miniature robotic machines, and, more particularly, to methods, systems, and apparatuses for implementing flexible printed circuit board ("PCB")-based mobile sensor platform.

In various embodiments, a flexible PCB-based mobile sensor platform includes a body portion(s) and at least one of a microcontroller, a locomotion system, sensors, a transceiver(s), and/or the like, each disposed on the body portion(s). The locomotion system includes one or more flexible PCB portions and corresponding actuators. Based on instructions from the microcontroller, at least one actuator may cause bending and unbending of a corresponding flexible PCB portion(s) that causes the flexible PCB-based mobile sensor platform to move toward a target location within a first environment. Upon arrival, the sensors may collect sensor data regarding at least one of the target location, an object located at the target location, or a portion of the object, and the microcontroller may send the collected sensor data to an external device via the transceiver.

In the various aspects described herein, a flexible PCB-based mobile sensor platform is provided, along with a method of controlling operation thereof. This allows for tasks to be performed in small, hard-to-reach, hard-to-access, and/or hazardous locations or structures. Such tasks may include, without limitation, optical fiber-based communications system inspection, monitoring, diagnosis, repair, and/or cleaning, or the like; agricultural field or facility monitoring; mining facility inspection and/or monitoring, or the like; hazardous location or facility inspection and/or monitoring, or the like; search and rescue operations (particularly in rubble-strewn locations and/or tight areas with small aperture access, or the like), or the like; or duct or piping inspection, monitoring, diagnosis, repair, and/or cleaning, or the like; and/or the like. The characteristics and features of the flexible PCB-based mobile sensor platform and its method of control, according to the various embodiments, also provide a novel and inventive manner of performing these tasks.

These and other aspects of the system and method for implementing flexible PCB-based mobile sensor platform are described in greater detail with respect to the figures.

The following detailed description illustrates a few embodiments in further detail to enable one of skill in the art to practice such embodiments. The described examples are provided for illustrative purposes and are not intended to limit the scope of the invention.

In the following description, for the purposes of explanation, numerous details are set forth in order to provide a thorough understanding of the described embodiments. It will be apparent to one skilled in the art, however, that other embodiments of the present invention may be practiced without some of these details. In other instances, some structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Various embodiments as described herein—while embodying (in some cases) software products, computer-performed methods, and/or computer systems—represent tangible, concrete improvements to existing technological areas, including, without limitation, miniature robotics technology, PCB-based device technology, flexible PCB-based device technology, autonomous miniature sensor platform technology, and/or the like. In other aspects, some embodiments can improve the functioning of user equipment or systems themselves (e.g., miniature robotics systems, PCB-based device systems, flexible PCB-based device systems, autonomous miniature sensor platform systems, etc.), for example, by controlling operation of a flexible printed circuit board ("PCB")-based mobile sensor platform, the flexible PCB-based mobile sensor platform comprising at least one body portion, a microcontroller disposed on the at least one body portion, one or more sensors disposed on the at least one body portion and configured to collect sensor data, a transceiver disposed on the at least one body portion, the transceiver being configured to receive wireless instructions for the microcontroller to execute and being configured to send the collected sensor data to an external device, and a locomotion system comprising one or more flexible PCB portions and corresponding one or more actuators, each actuator among the one or more actuators communicatively coupled to the microcontroller and configured to cause a corresponding flexible PCB portion among the one or more flexible PCB portions to bend and unbend, by sending, using the microcontroller, instructions to at least one actuator among the one or more actuators; in response to receiving the instructions, causing, using the at least one actuator, bending and unbending of corresponding at least one flexible PCB portion among the one or more flexible PCB portions that causes the flexible PCB-based mobile sensor platform to move toward a target location within a first environment, by moving along at least one first direction; and in response to determining that the flexible PCB-based mobile sensor platform has arrived at the target location, collecting, using the one or more sensors, sensor data regarding at least one of the target location, an object located at the target location, or a portion of the object, and sending, using the microcontroller, the collected sensor data to the external device via the transceiver; and/or the like.

In particular, to the extent any abstract concepts are present in the various embodiments, those concepts can be implemented as described herein by devices, software, systems, and methods that involve novel functionality (e.g., steps or operations), such as, providing a flexible PCB-based mobile sensor platform that is capable of performing tasks (including, but not limited to, at least one of inspection, monitoring, diagnosis, repair, and/or cleaning, or the like) in small, hard-to-reach, hard-to-access, and/or hazardous locations or structures, and/or the like, to name a few examples, that extend beyond mere conventional computer processing operations. These functionalities can produce tangible results outside of the implementing computer system, including, merely by way of example, a flexible PCB-based mobile sensor platform that is operable to move using the actuation mechanisms as described herein with respect to the figures and their corresponding descriptions to perform the aforementioned tasks within small, hard-to-reach, hard-to-access, and/or hazardous locations or structures, at least some of which may be observed or measured by users, device manufacturers, or the like.

Some Embodiments

We now turn to the embodiments as illustrated by the drawings. FIGS. 1-5 illustrate some of the features of the method, system, and apparatus for implementing miniature robotic machines, and, more particularly, to methods, systems, and apparatuses for implementing flexible printed circuit board ("PCB")-based mobile sensor platform, as referred to above. The methods, systems, and apparatuses illustrated by FIGS. 1-5 refer to examples of different embodiments that include various components and steps, which can be considered alternatives or which can be used in conjunction with one another in the various embodiments. The description of the illustrated methods, systems, and apparatuses shown in FIGS. 1-5 is provided for purposes of illustration and should not be considered to limit the scope of the different embodiments.

With reference to the figures, FIG. 1 is a schematic diagram illustrating a system 100 for implementing a flexible printed circuit board ("PCB")-based mobile sensor platform, in accordance with various embodiments.

In the non-limiting embodiment of FIG. 1, system 100 may comprise a flexible PCB-based mobile sensor platform 105, which may include at least one body portion 110. The flexible PCB-based mobile sensor platform 105 may further include, without limitation, at least one of a microcontroller 115, a locomotion system 120, one or more sensors 125, a transceiver(s) 130, one or more tools 135, one or more cameras 140, one or more light emitting diodes ("LEDs") or other lighting devices 145, or a power source or supply 150, and/or the like, each of which may be disposed on the at least one body portion 110. In some cases, the one or more tools 135 may include, but are not limited to, at least one of the one or more sensors 125, the one or more cameras 140, the one or more LEDs 145, a cleaning surface(s) (configured to clean one or more objects, such as but not limited to optical fiber cables or portions thereof, etc.), or other tools, and/or the like.

The one or more sensors 125 may be configured to collect sensor data. In some cases, the one or more sensors 125 may include, without limitation, at least one of one or more cameras (e.g., camera(s) 140, or the like), one or more ultraviolet ("UV") light sensors, one or more infrared ("IR") light sensors, one or more radio frequency ("rf") sensors, one or more miniature cameras (e.g., camera(s) 140, or the like), one or more miniature UV light sensors, one or more miniature IR light sensors, one or more miniature rf sensors, one or more gas sensors, one or more air quality sensors, one or more motion sensors, one or more sound sensors, or one or more signal detectors, and/or the like. The transceiver(s) 130 may be configured to receive wireless instructions for the microcontroller 115 to execute and may be configured to send the collected sensor data to at least one of one or more external devices 190*a* located within a first environment 185 and/or one or more external devices 190*b* located outside the first environment 185 (as depicted in FIG. 1 by lightning bolt symbols, or the like). According to some embodiments, the first environment 185 may include, but is not limited to, one of an optical fiber-based communications system location, an agricultural location, a mining location, a hazardous location, a rubble-strewn search and rescue location, or a confined duct or piping, and/or the like. In some instances, the external device(s) 190*a* and/or 190*b* may each include, without limitation, at least one of a smart phone, a mobile phone, a tablet computer, a laptop computer, a desktop computer, a server computer, a wireless access point, a wireless data relay device, a wireless data hub, or a data collection system, and/or the like. According to some embodiments, the power source or supply 150 may include, but is not limited to, at least one of a wired connection to an external power supply, a battery, a wireless induction-based power source, a solar power-based power source, a mechanical energy storage power source, a spring-based mechanical energy storage power source, a piezo-electric-based energy storage power source, or an energy scavenging circuit-based power source, and/or the like.

The locomotion system 120 may include, but is not limited to, one or more flexible PCB portions 155 and corresponding one or more actuators 160, each actuator 160 among the one or more actuators 160 communicatively coupled to the microcontroller 115 and configured to cause a corresponding flexible PCB portion 155 among the one or more flexible PCB portions 155 to bend and unbend. In response to receiving instructions from the microcontroller 115, at least one actuator 160 among the one or more actuators 160 may cause bending and unbending of corresponding at least one flexible PCB portion 155 among the one or more flexible PCB portions 155 that causes the flexible PCB-based mobile sensor platform 110 to move toward a target location 175 within a first environment 185, by moving along at least one first direction. In response to determining that the flexible PCB-based mobile sensor platform 105 has arrived at the target location 175, the one or more sensors 125 may collect sensor data regarding at least one of the target location, an object located at the target location, or a portion of the object, and the microcontroller sends the collected sensor data to the external device via the transceiver.

In some embodiments, each flexible PCB portion 155 may be made of a material including, but not limited to, at least one of polyimide, polyester, polyethylene terephthalate ("PET"), or polyethylene naphthalate ("PEN"), and/or the like. In some instances, the at least one body portion 110 may be made of the same material as the flexible PCB portion 155. Alternatively, the at least one body portion 110 may be made of one or more different materials including, but not limited to, a material that is more rigid than the material(s) for the flexible PCB portion 155, a material that is more flexible than the material(s) for the flexible PCB portion 155, a material that allows for a tighter bend radius compared with the material(s) for the flexible PCB portion 155, a single material, or a composite material, and/or the like. In some cases, the material for the at least one body portion 110 may include, but is not limited to, a metal (e.g., aluminum, titanium, steel, etc.), a metal alloy, plastic material (e.g., acrylonitrile butadiene styrene ("ABS"), acrylic or polymethyl methacrylate ("PMMA"), polycarbonate ("PC"), polyethylene ("PE"), polypropylene ("PP"), polyethylene terephthalate ("PET"), polyvinyl chloride ("PVC"), and/or the like), and/or carbon fiber material, and/or the like. According to some embodiments, the one or more flexible PCB portions 155 may include, without limitation, at least one flexible PCB portion 155 that is folded with at least one fold such that a first portion of a first surface faces a second portion of the first surface (and, where applicable, that a third portion of the first surface faces a fourth portion of the first surface, or more pairs of portions depending on the number of folds). In some instances, the one or more actuators 160 may include, but are not limited to, at least one actuator 160 disposed on at least one of the first portion, the second portion, the third portion, or the fourth portion of the first surface. In some cases, actuation of the at least one actuator may cause the switch between one of two states, the two states comprising an attraction state between the first and second portions (and between the third and fourth portions, and between other pairs of portions, as applicable) and a repulsion state between the first and second portions (and between the third and fourth portions, and between other pairs of portions, as applicable). In some instances, switching between the attraction state and the repulsion state in a preconfigured mode may cause the flexible PCB-based mobile sensor platform to move toward the target location 175.

According to some embodiments, the at least one actuator 155 may include, without limitation, at least one magnet or magnetic material 165 among one or more magnets or magnetic materials 165a-165n that is disposed on one of the first portion or the second portion and at least one (spiral) PCB coil 170 among one or more PCB coils 170a-170n that is printed or disposed on the other of the first portion or the second portion. Herein, "printed" may refer to any suitable set of processes used to form traces or other semiconductor patterns on a PCB layer (including on a flexible PCB layer), and is known to a person of ordinary skill in the art. In some cases, the attraction state may be implemented by energizing the at least one spiral PCB coil in a first current direction causing a magnetic field-based attraction between the at least one spiral PCB coil and the at least one magnetic material, thereby resulting in the first and second portions moving toward each other. In a similar manner, the repulsion state may be implemented by energizing the at least one spiral PCB coil in a second current direction that is opposite to the first current direction causing a magnetic field-based repulsion between the at least one spiral PCB coil and the at least one magnetic material, thereby resulting in the first and second portions moving away from each other.

Alternatively, the at least one actuator 155 may include, without limitation, at least one first magnet or magnetic material 165 among one or more magnets or magnetic materials 165a-165n that is disposed on one of the first portion or the second portion, at least one first (spiral) PCB coil 170 among one or more PCB coils 170a-170n that is printed on the other of the first portion or the second portion, at least one second magnet or magnetic material 165 among one or more magnets or magnetic materials 165a-165n that is disposed on one of the third portion or the fourth portion, and at least one second (spiral) PCB coil 170 among one or more PCB coils 170a-170n that is printed on the other of the third portion or the fourth portion (e.g., as shown in the corresponding non-limiting examples 200, 200', and 200'''' of FIGS. 2A-2C, 2E-2G, and 2Q-2S, or the like). In some cases, the attraction state may be implemented by energizing each of the at least one first and second spiral PCB coils in a first current direction causing a magnetic field-based attraction between the at least one first spiral PCB coil and the at least one first magnetic material and between the at least one second spiral PCB coil and the at least one second magnetic material, thereby resulting in the first and second portions moving toward each other and in the third and fourth portions moving toward each other. In a similar manner, the repulsion state may be implemented by energizing each of the at least one first and second spiral PCB coils in a second current direction that is opposite to the first current direction causing a magnetic field-based repulsion between the at least one first spiral PCB coil and the at least one first magnetic material and between the at least one second spiral PCB coil and the at least one second magnetic material, thereby resulting in the first and second portions moving away from each other and in the third and fourth portions moving away from each other.

Alternatively, the at least one actuator 155 may include, without limitation, at least one first magnet or magnetic material 165 among one or more magnets or magnetic materials 165a-165n that is disposed on the first portion, at least one first (spiral) PCB coil 170 among one or more PCB coils 170a-170n that is printed on one of the second portion or the third portion, and at least one second magnet or magnetic material 165 among one or more magnets or magnetic materials 165a-165n that is disposed on the fourth portion (e.g., as shown in the corresponding non-limiting example 200'' of FIGS. 2H-2J, or the like). In some cases, the attraction state may be implemented by energizing the at least one first spiral PCB coil in a first current direction causing a magnetic field-based attraction between the at least one first spiral PCB coil and each of the first and second magnetic materials, thereby resulting in the first and fourth portions moving toward the one of the second portion or the third portion. In some cases, the repulsion state may be implemented by energizing the first spiral PCB coil in the second current direction that is opposite to the first current direction causing a magnetic field-based repulsion between the first spiral PCB coil and each of the first and second magnetic materials, thereby resulting in the first and fourth portions moving away from the one of the second portion or the third portion.

Alternatively, the at least one actuator 155 may include, without limitation, at least one first (spiral) PCB coil 170 among one or more PCB coils 170a-170n that is printed on the first portion, at least one first magnet or magnetic material 165 among one or more magnets or magnetic materials 165a-165n that is disposed on one of the second portion or the third portion, and at least one second (spiral) PCB coil 170 among one or more PCB coils 170a-170n that is printed on the fourth portion (e.g., as shown in the corresponding non-limiting example 200''' of FIGS. 2K-2M, or the like). In some cases, the attraction state may be implemented by energizing each spiral PCB coil in the first current direction causing a magnetic field-based attraction between each spiral PCB coil and the first magnetic material, thereby resulting in the first and fourth portions moving toward the one of the second portion or the third portion. In some instances, the repulsion state may be implemented by energizing each spiral PCB coil in the second current direction that is opposite to the first current direction causing a magnetic field-based repulsion between each spiral PCB coil and the first magnetic material, thereby resulting in the first and fourth portions moving away from the one of the second portion or the third portion.

In some cases, each of the first and second portions (and third and fourth portions, where applicable) of the first surface may include a pair of side-by-side actuators (each actuator including a magnet 165 paired with or facing a corresponding spiral PCB coil 170) that is configured to independently actuate to cause the flexible PCB-based mobile sensor platform to turn to a right-side or a left-side based on differential attraction or repulsion of the side-by-side actuators (e.g., as shown in the corresponding non-limiting examples 200'''' and 300' of FIGS. 2Q-2S and 3Q-3R, or the like).

The flexible PCB-based mobile sensor platform according to various embodiments may be used to perform one or more of the following tasks: optical fiber-based communications system inspection, monitoring, diagnosis, repair, and/or cleaning, or the like; agricultural field or facility monitoring; mining facility inspection and/or monitoring, or the like; hazardous location or facility inspection and/or monitoring, or the like; search and rescue operations (particularly in rubble-strewn locations and/or tight areas with small aperture access, or the like), or the like; or duct or piping inspection, monitoring, diagnosis, repair, and/or cleaning, or the like; and/or the like.

These and other functions of the system 100 (and its components) are described in greater detail below with respect to FIGS. 2-4.

FIGS. 2A-2S (collectively, "FIG. 2") are schematic diagrams illustrating various non-limiting examples 200, 200', 200'', 200''', 200'''', and 200''''' of a flexible PCB-based mobile sensor platform, in accordance with various embodiments.

In the non-limiting examples 200, 200', 200'', 200''', 200'''', and 200''''' of FIG. 2, flexible PCB-based mobile sensor platform(s) 205 (including, but not limited to, flexible PCB-based mobile sensor platform 205a, 205b, 205c, 205d, 205e, and/or 205f; and/or the like; similar to flexible PCB-based mobile sensor platform(s) 105 of FIG. 1, or the like), each comprising at least one body portion 210 (similar to body portion 110 of FIG. 1, or the like), which may include a first surface 210a, a second surface 210b, and at least one flexible PCB portion that may be folded with a plurality of folds such that a first portion of the first surface 210a faces a second portion of the first surface 210a and a third portion of the first surface 210a faces a fourth portion of the first surface 210a. Each flexible PCB-based mobile sensor platform(s) 205 may further comprise at least two pairs of flexible PCB leg portions 215, each including a first surface 215a, a second surface 215b, and a foot portion 215c. Each flexible PCB-based mobile sensor platform(s) 205 may further comprise one or more magnets or magnetic portions 220 and one or more spiral PCB coils 225, which may be disposed on portions of the first surface 210a (e.g., one or more of the first through fourth portions of the first surface 210a, or the like). In some cases, each flexible PCB-based mobile sensor platform(s) 205 may further comprise one or more magnets or magnetic portions 230 and one or more spiral PCB coils 235, which may be disposed on portions of the second surface 210b, or the like. In some instances, each flexible PCB-based mobile sensor platform(s) 205 may further comprise one or more magnets or magnetic portions 240 and one or more spiral PCB coils 245, which may be disposed on portions the flexible PCB leg portions 215 (e.g., foot portions 215c of the flexible PCB leg portions 215, etc.). At least one of the one or more magnets or magnetic portions 220, the one or more magnets or magnetic portions 230, or the one or more magnets or magnetic portions 240 (collectively, "magnets 220, 230, and/or 240" or "magnetic portions 220, 230, and/or 240," or the like), and/or the like, may correspond to the one or more magnets or magnetic portions 165a-165n of FIG. 1, or the like. Similarly, at least one of the one or more spiral PCB coils 225, the one or more spiral PCB coils 235, or the one or more spiral PCB coils 245 (collectively, "spiral PCB coils 225, 235, and/or 245" or "spiral coils 225, 235, and/or 245," or the like), and/or the like, may correspond to the one or more spiral PCB coils 170a-170n of FIG. 1, or the like. In some instances, magnets 220, 230, and/or 240 and spiral PCB coils 225, 235, and/or 245 may be part of actuator(s) (similar to actuator(s) 160 of FIG. 1, or the like), which may be disposed on flexible PCB portions (similar to flexible PCB portions 155 of FIG. 1, or the like). Although spiral PCB coils 225, 235, and 245 are depicted in FIG. 2 as extending above other portions of the first surface 210, this is merely for purposes of illustration, and the spiral PCB coils 225, 235, and 245 may extend as far above the first surface 210 as other PCB traces or components, or the like.

According to some embodiments, each flexible PCB-based mobile sensor platform(s) 205 may further comprise one or more components 250 and/or 255, each including, without limitation, at least one of a microcontroller (similar to microcontroller 115 of FIG. 1, or the like), one or more sensors (similar to one or more sensors 125 of FIG. 1, or the like), one or more transceivers (similar to one or more transceivers 130 of FIG. 1, or the like), one or more tools (similar to one or more tools 135 of FIG. 1, or the like), one or more cameras (similar to one or more cameras 140 of FIG. 1, or the like), one or more light emitting diode ("LED") indicator lights (similar to one or more LED indicator lights 145 of FIG. 1, or the like), or a power source or supply (similar to power source or supply 150 of FIG. 1, or the like), and/or the like.

In the non-limiting example 200 of FIGS. 2A-2D, flexible PCB-based mobile sensor platform 205a comprises at least one body portion 210 having a first surface 210a, a second surface 210b, and at least one flexible PCB portion. As shown in FIGS. 2A-2C, a front and a rear portion of the at least one body portion 210 may be set to be flat (although capable of being bent or curved), and disposed (and in some cases, mounted) on these portions may be one or more components 250 and/or 255 (as described above), respectively. As also shown in FIGS. 2A and 2C, two magnets 220 and two spiral PCB coils 225 may be disposed on the first surface 210a, with the at least one flexible PCB portion being folded with a plurality of folds such that one magnet 220 disposed on a first portion of the first surface 210a faces one spiral PCB coil 225 disposed on a second portion of the first surface 210a and the other magnet 220 disposed on a third portion of the first surface 210a faces the other spiral PCB coil 225 disposed on a fourth portion of the first surface 210a (with a total, in this case, of three folds and four portions as shown in FIG. 2A). In some cases, as shown in FIG. 2A, a magnet 230 disposed on a first portion of the second surface 210b (which is opposite to the first surface 210a) is configured to face a spiral PCB coil 235 on a second portion of the second surface 210b, within the plurality of folds. Energizing (e.g., running a current through each of the spiral PCB coil 225 and/or 235) will generate a magnetic field that attracts the corresponding magnet (e.g., magnet 220 or 230 that faces the energized spiral PCB coil 225 or 235), resulting in the first (or third) portion and the second (or fourth) portion of the first surface 210a being attracted to each other, and/or the first and second portions of the second surface 210b, thereby contracting the flexible PCB-based mobile sensor platform 205a along its length (in a manner not unlike that of contraction of an accordion, or the like).

According to some embodiments, as shown in FIGS. 2A and 2B, pairs of leg portions 215 may extend from the front and rear portions of the at least one body portion 210, with the first surface 215a extending from the first surface 210a of the at least one body portion 210, while the second surface 215b extends from the second surface 210b of the at least one body portion 210. In some cases, the leg portions 215 may be formed from the at least one body portion 210, with the leg portions 215 being folded 90 degrees with respect to each other, as shown in FIGS. 2A and 2B. FIGS. 2A, 2B, and 2C depict a side view, a front view, and a top view, respectively, of the flexible PCB-based mobile sensor platform 205a.

With reference to FIG. 2D, partial views are shown of each of a pair of leg portions 215, showing the second surfaces 215b thereof and showing the magnet 240 on a foot portion 215c and a corresponding spiral PCB coil 245 on the foot portion 215c facing the magnet 240. In some cases, the magnet 240 is affixed to the foot portion 215c of the leg portion 215 using a suitable adhesive, or the like. As shown in the right-hand side of FIG. 2D, the solid line denotes a trace pattern on the second surface 215b, while the dashed line denotes a trace pattern on the opposite surface (i.e., the first surface 215a; trace pattern not expressly shown on the first surface 215a in FIG. 2), with the solid line being coupled to the dashed line through vias in the leg portion 215 (not shown). Although a particular configuration and pattern is shown on the right-hand side of FIG. 2D for the spiral PCB coil 245 on the foot portion 215c of the second portion 215b of the leg portion 215, the various embodiments are not so limited, and any suitable coil pattern may be used that effects a magnetic field when current is applied. Similar to the functionality of the magnets 220 (or 230) and corresponding spiral PCB coil 225 (or 235), energizing (e.g., running a current through each of spiral PCB coil 245) will generate a magnetic field that attracts the corresponding magnet (e.g., magnet 240 that faces the energized spiral PCB coil 245), resulting in the corresponding foot portions 215c being attracted to each other, thereby causing the foot portions 215c to "clamp" onto objects (e.g., an optical fiber cable, such as shown in FIGS. 3A-3H, or the like).

In the non-limiting example 200' of FIGS. 2E-2G, flexible PCB-based mobile sensor platform 205b is similar, if not identical, to flexible PCB-based mobile sensor platform 205a of FIGS. 2A-2D, except that flexible PCB-based mobile sensor platform 205b does not comprise magnet 230 and spiral PCB coil 235 of example 200 of FIGS. 2A-2C. FIGS. 2E, 2F, and 2G depict a side view, a front view, and a top view, respectively, of the flexible PCB-based mobile sensor platform 205b.

In the non-limiting example 200" of FIGS. 2H-2J, flexible PCB-based mobile sensor platform 205c is similar, if not identical, to flexible PCB-based mobile sensor platform 205b of FIGS. 2E-2G, except that magnets 220 are disposed on first and fourth portions of the first surface 210a, while a spiral PCB coil 225 is disposed on one of the second portion or the third portion of the first surface 210a. Energizing the single spiral PCB coil 225 would cause the magnets 220 (and the first and fourth portions) to contract toward (or be attracted to) the second or third portion, thereby contracting the flexible PCB-based mobile sensor platform 205c along its length, in a manner as described in detail above with respect to contraction of flexible PCB-based mobile sensor platform 205a. FIGS. 2H, 2I, and 2J depict a side view, a front view, and a top view, respectively, of the flexible PCB-based mobile sensor platform 205c.

In the non-limiting example 200''' of FIGS. 2K-2M, flexible PCB-based mobile sensor platform 205d is similar, if not identical, to flexible PCB-based mobile sensor platform 205b of FIGS. 2E-2G, except that spiral PCB coils 225 are disposed on first and fourth portions of the first surface 210a, while a magnet 220 is disposed on one of the second portion or the third portion of the first surface 210a. Energizing the spiral PCB coils 225 would cause the magnet 220 (and the second or third portion) to contract toward (or be attracted to) the first and fourth portions, thereby contracting the flexible PCB-based mobile sensor platform 205d along its length, in a manner as described in detail above with respect to contraction of flexible PCB-based mobile sensor platform 205a. FIGS. 2K, 2L, and 2M depict a side view, a front view, and a top view, respectively, of the flexible PCB-based mobile sensor platform 205d.

In the non-limiting example 200'''' of FIGS. 2N-2P, flexible PCB-based mobile sensor platform 205e is similar, if not identical, to flexible PCB-based mobile sensor platform 205b of FIGS. 2E-2G, except that flexible PCB-based mobile sensor platform 205e comprises an additional fold, with magnets 220 disposed on the third portion and the sixth portion of the first surface 210a and spiral PCB coils 225 disposed on the first and fourth portions of the first surface 210a. Energizing the spiral PCB coils 225 would cause the magnets 220 (and the third and sixth portions) to contract toward (or be attracted to) the first and fourth portions, thereby contracting the flexible PCB-based mobile sensor platform 205e along its length, in a manner as described in detail above with respect to contraction of flexible PCB-based mobile sensor platform 205a. FIGS. 2N, 2O, and 2P depict a side view, a front view, and a top view, respectively, of the flexible PCB-based mobile sensor platform 205e.

In the non-limiting example 200''''' of FIGS. 2Q-2S, flexible PCB-based mobile sensor platform 205f is similar, if not identical, to flexible PCB-based mobile sensor platform 205b of FIGS. 2E-2G, except that flexible PCB-based mobile sensor platform 205f may be wider to accommodate two side-by-side magnets 220 (e.g., magnets 220l and 220r) and two side-by-side spiral PCB coils 225 (e.g., spiral PCB coils 225l and 225r) for each pair of magnet 220 and spiral PCB coils 225 (collectively, "actuator" or the like) of flexible PCB-based mobile sensor platform 205b of example 200' of FIGS. 2E-2G. A pair of side-by-side actuators that is configured to independently actuate to cause the flexible PCB-based mobile sensor platform to turn to a right-side or a left-side based on differential attraction or repulsion of the side-by-side actuators, such as shown and described below with respect to FIGS. 3Q and 3R, or the like. FIGS. 2Q, 2R, and 2S depict a side view, a front view, and a top view, respectively, of the flexible PCB-based mobile sensor platform 205f.

These and other functions of the examples 200, 200', 200", 200''', 200'''', and 200''''' (and their components) are described in greater detail herein with respect to FIGS. 1, 3, and 4.

Figure 3J:
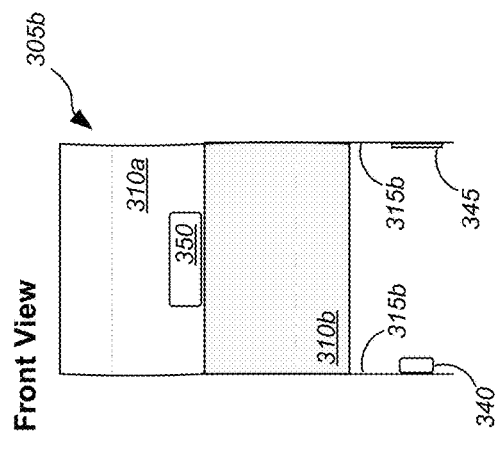
FIGS. 3A-3R are schematic diagrams illustrating a non-limiting example of the movement of various examples of a flexible PCB-based mobile sensor platform during their implementation, in accordance with various embodiments.
Figure 3L:
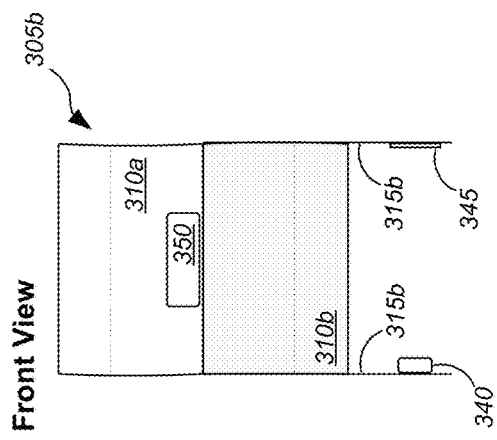
Figure 3I:
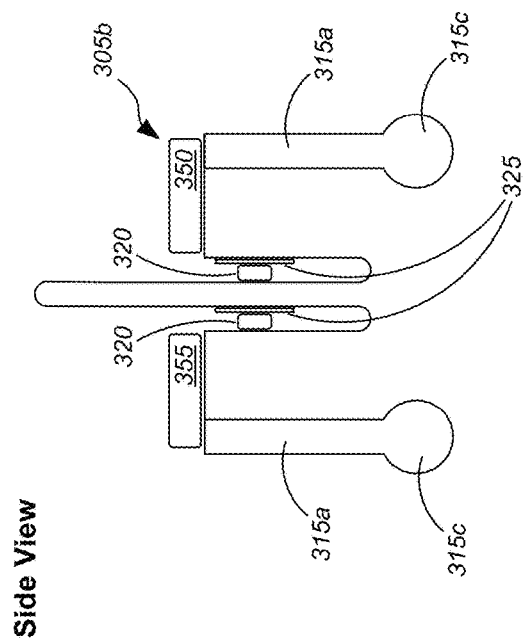
Figure 3K:
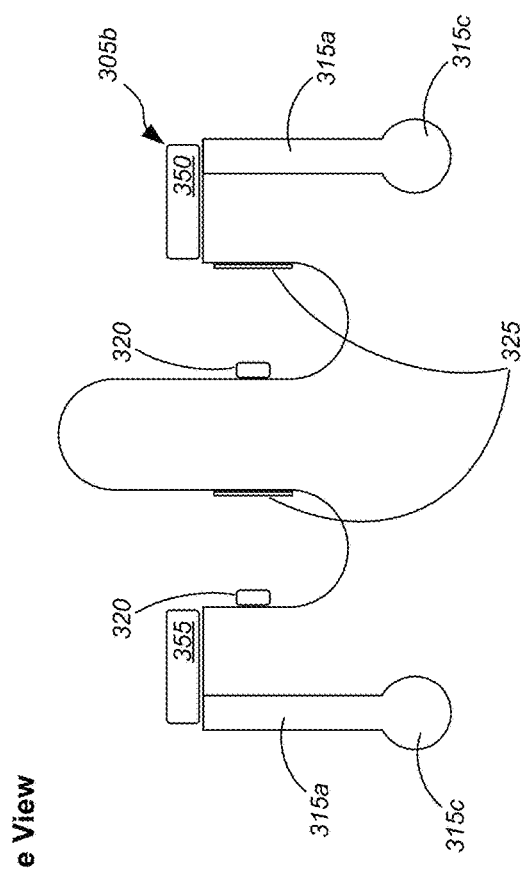
Figure 3N:
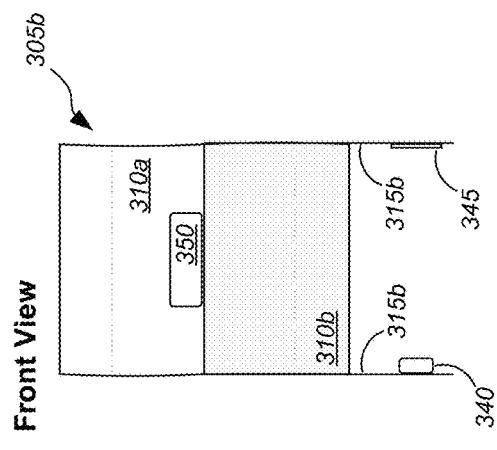
Figure 3P:
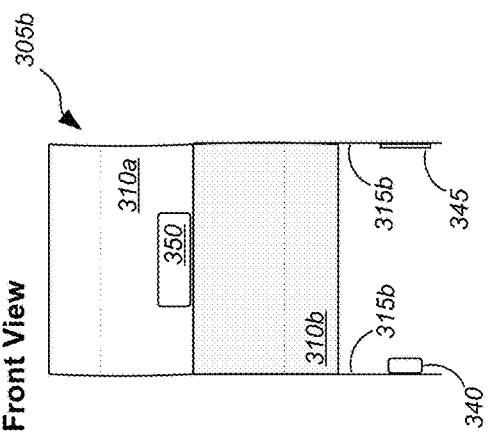
Figure 3M:
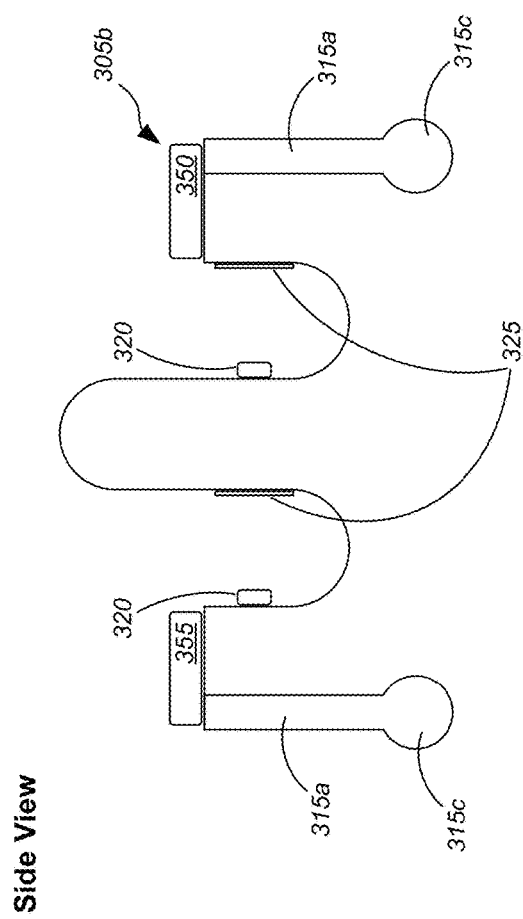
Figure 3O:
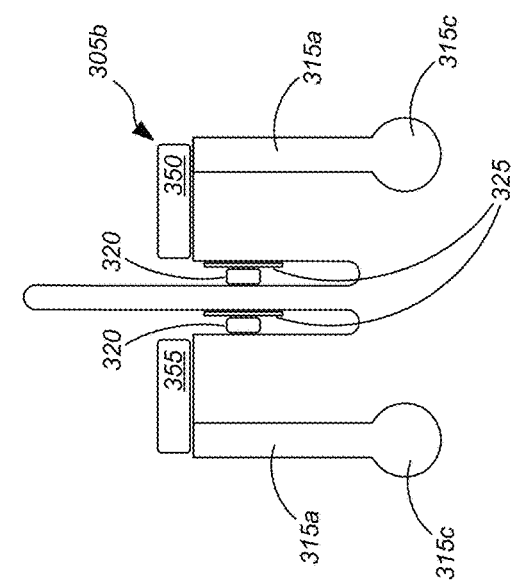

FIGS. 3A-3R (collectively, "FIG. 3") are schematic diagrams illustrating various non-limiting examples of the movement of various examples 300 and 300' of a flexible PCB-based mobile sensor platform during their implementation, in accordance with various embodiments. FIGS. 3A-3H depict a non-limiting example 300 of a flexible PCB-based mobile sensor platform 305a moving along a length of optical fiber cable 360, while FIGS. 3I-3R depict a non-limiting example 300' of a flexible PCB-based mobile sensor platform 305b moving about an environment along at least two dimensions.

With reference to the non-limiting example 300 of FIGS. 3A-3H, flexible PCB-based mobile sensor platform 305a is similar, if not identical, to flexible PCB-based mobile sensor platform 205b of FIGS. 2E-2G, or the like, with first surface 310a, second surface 310b, leg portions 315 (and sub-portions 315a-315c), magnets 320, spiral PCB coils 325, magnets 340a and 340b, spiral PCB coils 345a and 345b, components 350, and components 355 of flexible PCB-based mobile sensor platform 305a of example 300 of FIGS. 3A-3H corresponding to first surface 210a, second surface 210b, leg portions 215 (and sub-portions 215a-215c), magnets 220, spiral PCB coils 225, magnets 240a and 240b, spiral PCB coils 245a and 245b, components 250, and components 255, respectively, of flexible PCB-based mobile sensor platform 205b of example 200' of FIGS. 2E-2G. In some embodiments, the at least one target location may comprise at least one portion of an optical fiber cable.

In such cases, the flexible PCB-based mobile sensor platform 305a may further include without limitation: a pair of flexible PCB front leg portions and a pair of flexible PCB rear leg portions, each pair extending from either side of the at least one body portion 310. Although not shown, each leg portion 315 may include a foot portion 315c that is made of (or is affixed with) a material that is soft or deformable and that provides traction against an outer cladding of the optical fiber cable 360. A first set of lateral actuators disposed on the pair of flexible PCB front leg portions (including magnet 340a and corresponding spiral PCB coil 345a), when actuated, is configured to switch between an attraction state between the front leg portions (i.e., between magnet 340a and corresponding spiral PCB coil 345a) and a repulsion state between the front leg portions (i.e., between magnet 340a and corresponding spiral PCB coil 345a). Similarly, a second set of lateral actuators disposed on the pair of flexible PCB rear leg portions (including magnet 340b and corresponding spiral PCB coil 345b), when actuated, is configured to switch between an attraction state between the rear leg portions (i.e., between magnet 340b and corresponding spiral PCB coil 345b) and a repulsion state between the rear leg portions (i.e., between magnet 340b and corresponding spiral PCB coil 345b).

In some cases, actuation of the first and second sets of lateral actuators may be coordinated with actuation of the at least one actuator of the locomotion system, such that forward motion of the flexible PCB-based mobile sensor platform may be achieved by repeating the following sequence: (a) the second set of lateral actuators (including magnet 340b and spiral PCB coil 345b, or the like) being set to the attraction state such that the foot portions 315c of the pair of flexible PCB rear leg portions (including magnet 340b and spiral PCB coil 345b; or alternatively a soft or deformable encasing each of magnet 340b or spiral PCB coil 345b (not shown)) are in contact with the optical fiber cable 360 (as shown, e.g., in FIGS. 3A (side view) and 3B (front view), or the like); (b) the first set of lateral actuators (including magnet 340a and spiral PCB coil 345a, or the like) being set to the repulsion state (as shown, e.g., in FIGS. 3A (side view) and 3B (front view), or the like); (c) the at least one actuator of the locomotion system (including magnets 320 and corresponding spiral PCB coils 325, or the like) causing unbending of the corresponding at least one flexible PCB portion, resulting in the pair of flexible PCB front leg portions moving forward along the optical fiber cable 360 relative to the pair of flexible PCB rear leg portions (as shown, e.g., in FIGS. 3C (side view) and 3D (front view), or the like); (d) the first set of lateral actuators being set to the attraction state such that the foot portions of the pair of flexible PCB front leg portions are set to contact with the optical fiber cable (as shown, e.g., in FIGS. 3E (side view) and 3F (front view), or the like); (e) the second set of lateral actuators (including magnet 340b and spiral PCB coil 345b, or the like) being set to the repulsion state (as shown, e.g., in FIGS. 3G (side view) and 3H (front view), or the like); and (f) the at least one actuator of the locomotion system (including magnets 320 and corresponding spiral PCB coils 325, or the like) causing bending of corresponding flexible PCB portions 325, resulting in the pair of flexible PCB rear leg portions moving forward along the optical fiber cable 360 relative to the pair of flexible PCB front leg portions (as shown, e.g., in FIGS. 3G (side view) and 3H (front view), or the like).

In some instances, although not shown, the target location may include one of a damaged portion of the optical fiber cable, a portion of the optical fiber cable with at least one exposed cladding layer, or a fiber optic connector disposed at an end of the optical fiber cable, and/or the like. In some cases, the one or more sensors may collect sensor data regarding at least one of the target location, state of the optical fiber cable, state of the fiber optic connector, or optical characteristics of the optical fiber cable, and/or the like. In some instances, the flexible PCB-based mobile sensor platform may further comprise one or more light emitting diode ("LED") indicator lights communicatively coupled to the microcontroller. The one or more LED indicator lights may be indicative of one or more of a functioning optical fiber cable, a damaged optical fiber cable, or a damaged fiber optic connector, and/or the like. In some cases, the flexible PCB-based mobile sensor platform may further include a cleaning surface extending from the at least one body portion, the cleaning surface being configured to drag along, and being configured to clean, the at least one portion of the optical fiber cable as the flexible PCB-based mobile sensor platform is moved along the optical fiber cable (not shown). In some instances, the flexible PCB-based mobile sensor platform may further include a probe extending from the at least one body portion, the probe comprising one or more end effectors including, but not limited to, one or more sensor-based end effectors (for optical fiber inspection, monitoring, and/or diagnosis, etc.), one or more optical fiber repair tools, one or more optical fiber cleaning tools, and/or the like. In some cases, each sensor-based end effector including, without limitation, at least one of one or more cameras, one or more ultraviolet ("UV") light sensors, one or more infrared ("IR") light sensors, one or more radio frequency ("rf") sensors, one or more miniature cameras, one or more miniature UV light sensors, one or more miniature IR light sensors, one or more miniature rf sensors, one or more gas sensors, one or more air quality sensors, one or more motion sensors, one or more sound sensors, or one or more signal detectors, and/or the like. According to some embodiments, the probe either may be a stationary probe affixed in a non-movable manner to a portion of the flexible PCB-based mobile sensor platform or may be an extendable probe that is affixed to the portion of the flexible PCB-based mobile sensor platform and that is configured to extend or retract using via mechanical, electrical, magnetic, and/or electromagnetic actuators (e.g., solenoid-based actuator, etc.), etc. In some embodiments, the probe may be used to observe an "end" of the fiber, which is where the internal fiber optic is exposed for termination and/or connection to another piece of fiber optic equipment.

With reference to the non-limiting example 300' of FIGS. 3I-3R, flexible PCB-based mobile sensor platform 305b is similar, if not identical, to flexible PCB-based mobile sensor platform 205f of FIGS. 2Q-2S, or the like, with first surface 310a, second surface 310b, leg portions 315 (and sub-portions 315a-315c), magnets 320l and 320r, spiral PCB coils 325l and 325r, magnets 340, spiral PCB coils 345, components 350, and components 355 of flexible PCB-based mobile sensor platform 305b of example 300' of FIGS. 3I-3R corresponding to first surface 210a, second surface 210b, leg portions 215 (and sub-portions 215a-215c), magnets 220l and 220r, spiral PCB coils 225l and 225r, magnets 240, spiral PCB coils 245, components 250, and components 255, respectively, of flexible PCB-based mobile sensor platform 205f of example 200'''' of FIGS. 2Q-2S.

According to some embodiments, the first environment may include, but is not limited to, one of an agricultural location, a mining location, a hazardous location, a rubble-strewn search and rescue location, or a confined duct or piping, and/or the like. In such cases, the flexible PCB-based mobile sensor platform 305b may further include without limitation: a pair of flexible PCB front leg portions and a pair of flexible PCB rear leg portions, each pair extending from either side of the at least one body portion 310. Although not shown, each leg portion 315 may include a foot portion 315c that is made of (or is affixed with) a material that provides traction against one or more surfaces in the first environment.

In some cases, forward motion of the flexible PCB-based mobile sensor platform 305b may be achieved by repeating the following sequence: (F1) the at least one actuator of the locomotion system (including magnets 320 and corresponding spiral PCB coils 325, or the like) causing unbending of the corresponding at least one flexible PCB portion, resulting in the pair of flexible PCB front leg portions moving forward along at least one surface in the first environment relative to the pair of flexible PCB rear leg portions (as shown, e.g., in the transition from FIGS. 3I (side view) and 3J (front view) to FIGS. 3K (side view) and 3L (front view), or the like); and (F2) the at least one actuator of the locomotion system causing bending of corresponding flexible PCB portions, resulting in the pair of flexible PCB rear leg portions moving forward along the at least one surface in the first environment relative to the pair of flexible PCB front leg portions (as shown, e.g., in the transition from FIGS. 3M (side view) and 3N (front view) to FIGS. 3O (side view) and 3P (front view), or the like).

In some embodiments, backward motion of the flexible PCB-based mobile sensor platform 305b may be achieved by repeating the following sequence: (B1) the at least one actuator of the locomotion system (including magnets 320 and corresponding spiral PCB coils 325, or the like) causing unbending of the corresponding at least one flexible PCB portion, resulting in the pair of flexible PCB rear leg portions moving backward along the at least one surface in the first environment relative to the pair of flexible PCB front leg portions (as shown, e.g., in the transition from FIGS. 3O (side view) and 3P (front view) to FIGS. 3M (side view) and 3N (front view), or the like); and (B2) the at least one actuator of the locomotion system causing bending of corresponding flexible PCB portions, resulting in the pair of flexible PCB front leg portions moving backward along the at least one surface in the first environment relative to the pair of flexible PCB rear leg portions (as shown, e.g., in the transition from FIGS. 3K (side view) and 3L (front view) to FIGS. 3I (side view) and 3J (front view), or the like).

In some cases, each of the first and second portions (and third and fourth portions, where applicable) of the first surface may include a pair of side-by-side actuators (each actuator including a magnet 320l or 320r paired with or facing a corresponding spiral PCB coil 325l or 325r) that is configured to independently actuate to cause the flexible PCB-based mobile sensor platform 305b to turn to a right-side or a left-side based on differential attraction or repulsion of the side-by-side actuators (e.g., as shown in the corresponding non-limiting example 300' of FIGS. 3Q and 3R, or the like).

In some embodiments, a left turn motion of the flexible PCB-based mobile sensor platform 305b may be achieved by the following sequence: (L1) the at least one actuator of the locomotion system (including a magnet 320l or 320r paired with or facing a corresponding spiral PCB coil 325l or 325r) causing bending of the actuators on the left-side (i.e., magnets 320l and corresponding spiral PCB coil 325l), while actuators on the right-side (i.e., magnets 320r and corresponding spiral PCB coil 325r) either are not actuated or are caused to be repelled from their sub-parts (e.g., magnet 320r and corresponding spiral PCB coil 325r), resulting in the left-side of flexible PCB-based mobile sensor platform 305b compressing while the right-side is not compressed, thus resulting in the front of the flexible PCB-based mobile sensor platform 305b pointing to the left relative to the rear of the flexible PCB-based mobile sensor platform 305b (as shown, e.g., in FIG. 3Q (top view), or the like).

Similarly, a right turn motion of the flexible PCB-based mobile sensor platform 305b may be achieved by the following sequence: (R1) the at least one actuator of the locomotion system (including a magnet 320l or 320r paired with or facing a corresponding spiral PCB coil 325l or 325r) causing bending of the actuators on the right-side (i.e., magnets 320r and corresponding spiral PCB coil 325r), while actuators on the left-side (i.e., magnets 320l and corresponding spiral PCB coil 325l) either are not actuated or are caused to be repelled from their sub-parts (e.g., magnet 320l and corresponding spiral PCB coil 325l), resulting in the right-side of flexible PCB-based mobile sensor platform 305b compressing while the left-side is not compressed, thereby resulting in the front of the flexible PCB-based mobile sensor platform 305b pointing to the right relative to the rear of the flexible PCB-based mobile sensor platform 305b (as shown, e.g., in FIG. 3R (top view), or the like).

These and other functions of the examples 300 and 300' (and their components) are described in greater detail herein with respect to FIGS. 1, 2, and 4.

Figure 4A:
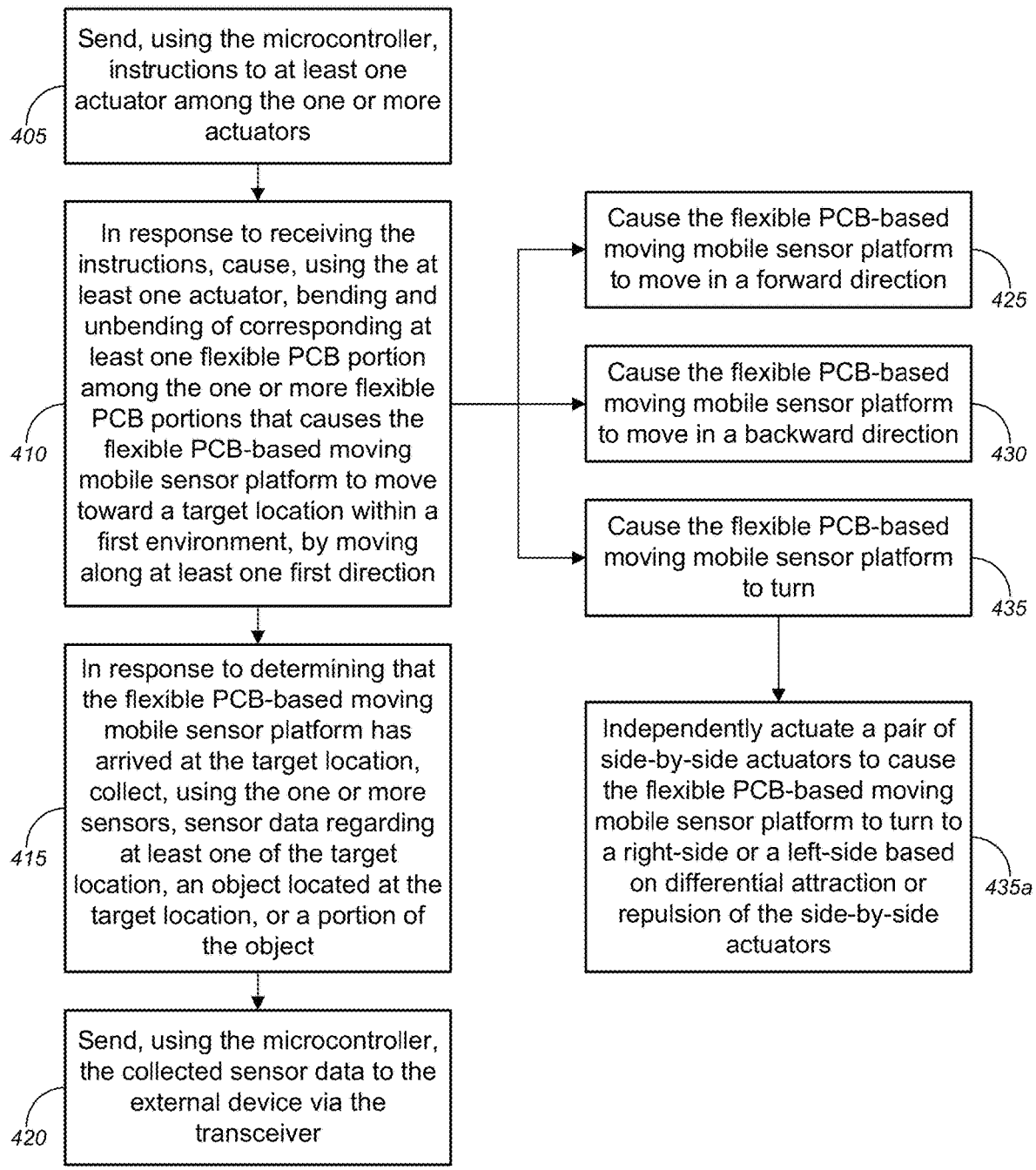
FIGS. 4A-4C are flow diagrams illustrating a method for implementing a flexible PCB-based mobile sensor platform, in accordance with various embodiments.
Figures 4B, 4C:
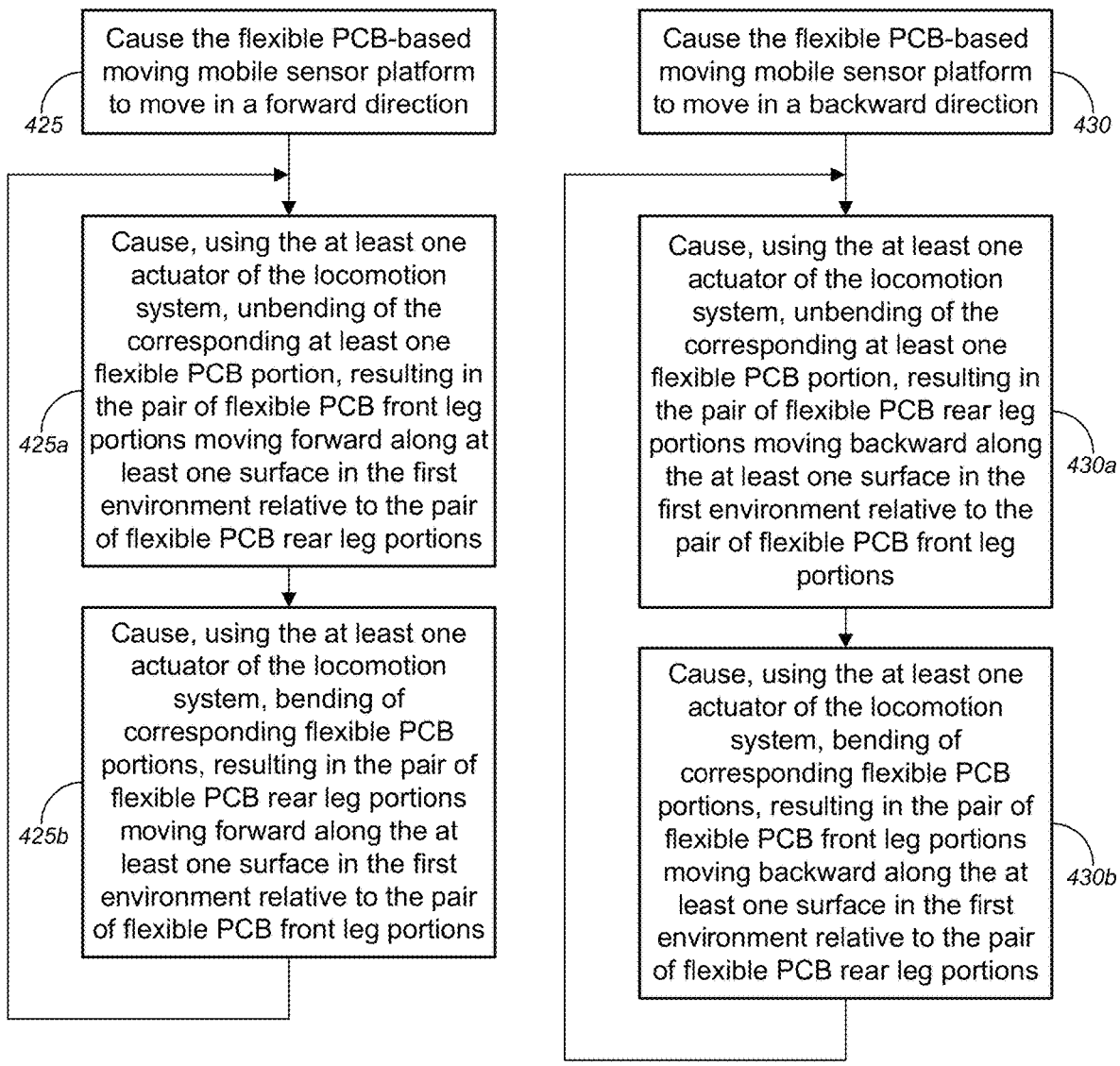

FIGS. 4A-4C (collectively, "FIG. 4") are flow diagrams illustrating a method 400 for implementing a flexible PCB-based mobile sensor platform, in accordance with various embodiments. In some embodiments, the flexible PCB-based mobile sensor platform may include, without limitation, at least one body portion, a microcontroller disposed on the at least one body portion, one or more sensors disposed on the at least one body portion and configured to collect sensor data, a transceiver disposed on the at least one body portion, the transceiver being configured to receive wireless instructions for the microcontroller to execute and being configured to send the collected sensor data to an external device, and a locomotion system comprising one or more flexible PCB portions and corresponding one or more actuators, each actuator among the one or more actuators communicatively coupled to the microcontroller and configured to cause a corresponding flexible PCB portion among the one or more flexible PCB portions to bend and unbend.

While the techniques and procedures are depicted and/or described in a certain order for purposes of illustration, it should be appreciated that certain procedures may be reordered and/or omitted within the scope of various embodiments. Moreover, while the method 400 illustrated by FIG. 4 can be implemented by or with (and, in some cases, are described below with respect to) the systems, examples, or embodiments 100, 200, 200', 200'', 200''', 200'''', and 200''''', 300, and 300' of FIGS. 1, 2A-2D, 2E-2G, 2H-2J, 2K-2M, 2N-2P, 2Q-2S, 3A-3H, and 3I-3R, respectively (or components thereof), such methods may also be implemented using any suitable hardware (or software) implementation. Similarly, while each of the systems, examples, or embodiments 100, 200, 200', 200'', 200''', 200'''', and 200''''', 300, and 300' of FIGS. 1, 2A-2D, 2E-2G, 2H-2J, 2K-2M, 2N-2P, 2Q-2S, 3A-3H, and 3I-3R, respectively (or components thereof), can operate according to the method 400 illustrated by FIG. 4 (e.g., by executing instructions embodied on a computer readable medium), the systems, examples, or embodiments 100, 200, 200', 200'', 200''', 200'''', and 200''''', 300, and 300' of FIGS. 1, 2A-2D, 2E-2G, 2H-2J, 2K-2M, 2N-2P, 2Q-2S, 3A-3H, and 3I-3R can each also operate according to other modes of operation and/or perform other suitable procedures.

In the non-limiting embodiment of FIG. 4A, method 400, at block 405, may comprise sending, using the microcontroller, instructions to at least one actuator among the one or more actuators. At block 410, method 400 may comprise, in response to receiving the instructions, causing, using the at least one actuator, bending and unbending of corresponding at least one flexible PCB portion among the one or more flexible PCB portions that causes the flexible PCB-based mobile sensor platform to move toward a target location within a first environment, by moving along at least one first direction. At block 415, method 400 may comprise, in response to determining that the flexible PCB-based mobile sensor platform has arrived at the target location, collecting, using the one or more sensors, sensor data regarding at least one of the target location, an object located at the target location, or a portion of the object. Method 400 may further comprise, at block 420, sending, using the microcontroller, the collected sensor data to the external device via the transceiver.

In some embodiments, the flexible PCB portion may be made of a material comprising at least one of polyimide, polyester, polyethylene terephthalate ("PET"), or polyethylene naphthalate ("PEN"), and/or the like. In some instances, the at least one body portion may be made of the same material as the flexible PCB portion. In some cases, the one or more sensors may comprise at least one of one or more cameras, one or more ultraviolet ("UV") light sensors, one or more infrared ("IR") light sensors, one or more radio frequency ("rf") sensors, one or more miniature cameras, one or more miniature UV light sensors, one or more miniature IR light sensors, one or more miniature rf sensors, one or more gas sensors, one or more air quality sensors, one or more motion sensors, one or more sound sensors, or one or more signal detectors, and/or the like. In some instances, the external device may comprise at least one of a smart phone, a mobile phone, a tablet computer, a laptop computer, a desktop computer, a server computer, a wireless access point, a wireless data relay device, a wireless data hub, or a data collection system, and/or the like.

According to some embodiments, the flexible PCB-based mobile sensor platform may further comprise at least one power source, the at least one power source comprising at least one of a wired connection to an external power supply, a battery, a wireless induction-based power source, a solar power-based power source, a mechanical energy storage power source, a spring-based mechanical energy storage power source, a piezo-electric-based energy storage power source, or an energy scavenging circuit-based power source, and/or the like.

In some embodiments, the one or more flexible PCB portions may comprise at least one flexible PCB portion that is folded with at least one fold such that a first portion of a first surface faces a second portion of the first surface. In some instances, the one or more actuators may comprise at least one actuator disposed on at least one of the first portion or the second portion of the first surface. In some cases, actuation of the at least one actuator may cause the switch between one of two states, the two states comprising an attraction state between the first and second portions and a repulsion state between the first and second portions. In some instances, switching between the attraction state and the repulsion state in a preconfigured mode may cause the flexible PCB-based mobile sensor platform to move toward the target location.

According to some embodiments, the at least one actuator may comprise a magnetic material that is disposed on one of the first portion or the second portion and a spiral PCB coil that is printed on the other of the first portion or the second portion. In some cases, the attraction state may be implemented by energizing the spiral PCB coil in a first current direction causing a magnetic field-based attraction between the spiral PCB coil and the magnetic material, thereby resulting in the first and second portions moving toward each other. In a similar manner, the repulsion state may be implemented by energizing the spiral PCB coil in a second current direction that is opposite to the first current direction causing a magnetic field-based repulsion between the spiral PCB coil and the magnetic material, thereby resulting in the first and second portions moving away from each other.

In some embodiments, causing bending and unbending of corresponding at least one flexible PCB portion among the one or more flexible PCB portions that causes the flexible PCB-based mobile sensor platform to move toward the target location within the first environment (at block 410) comprises at least one of causing the flexible PCB-based moving mobile sensor platform to move in a forward direction (block 425); causing the flexible PCB-based moving mobile sensor platform to move in a backward direction (block 430); and/or causing the flexible PCB-based moving mobile sensor platform to turn (block 435). In some cases, causing the flexible PCB-based moving mobile sensor platform to turn (at block 435) may comprise independently actuating a pair of side-by-side actuators to cause the flexible PCB-based mobile sensor platform to turn to a right-side or a left-side based on differential attraction or repulsion of the side-by-side actuators (block 435*a*).

With reference to FIG. 4B, causing the flexible PCB-based moving mobile sensor platform to move in a forward direction (at block 425) may comprise causing, using the at least one actuator of the locomotion system, unbending of the corresponding at least one flexible PCB portion, resulting in the pair of flexible PCB front leg portions moving forward along at least one surface in the first environment relative to the pair of flexible PCB rear leg portions (block 425*a*); and causing, using the at least one actuator of the locomotion system, bending of corresponding flexible PCB portions, resulting in the pair of flexible PCB rear leg portions moving forward along the at least one surface in the first environment relative to the pair of flexible PCB front leg portions (block 425*b*); and repeating the processes at blocks 425*a* and 425*b* as necessary or as desired to maintain forward motion.

Similarly, referring to FIG. 4C, causing the flexible PCB-based moving mobile sensor platform to move in a backward direction (at block 430) may comprise causing, using the at least one actuator of the locomotion system, unbending of the corresponding at least one flexible PCB portion, resulting in the pair of flexible PCB rear leg portions moving backward along the at least one surface in the first environment relative to the pair of flexible PCB front leg portions (block 430*a*); and causing, using the at least one actuator of the locomotion system, bending of corresponding flexible PCB portions, resulting in the pair of flexible PCB front leg portions moving backward along the at least one surface in the first environment relative to the pair of flexible PCB rear leg portions (block 430*b*); and repeating the processes at blocks 430*a* and 430*b* as necessary or as desired to maintain backward motion.

Examples of System and Hardware Implementation

Figure 5:
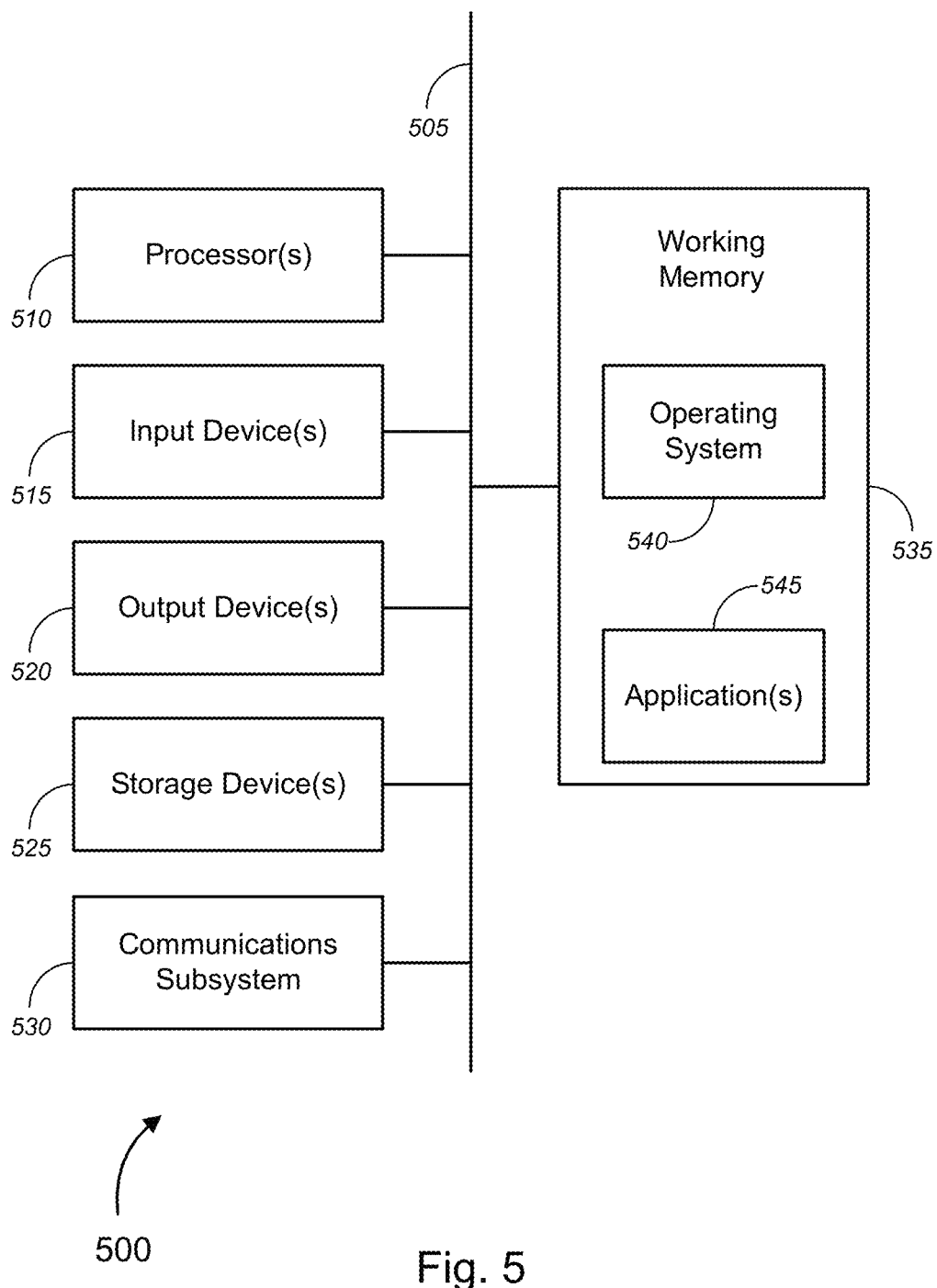
FIG. 5 is a block diagram illustrating an example of computer or system hardware architecture, in accordance with various embodiments.

FIG. 5 is a block diagram illustrating an example of computer or system hardware architecture, in accordance with various embodiments. FIG. 5 provides a schematic illustration of one embodiment of a computer system 500 of the service provider system hardware that can perform the methods provided by various other embodiments, as described herein, and/or can perform the functions of computer or hardware system (i.e., microcontroller 115 and external devices 190*a*-190*b*, etc.), as described above. It should be noted that FIG. 5 is meant only to provide a generalized illustration of various components, of which one or more (or none) of each may be utilized as appropriate. FIG. 5, therefore, broadly illustrates how individual system elements may be implemented in a relatively separated or relatively more integrated manner.

The computer or hardware system 500—which might represent an embodiment of the computer or hardware system (i.e., microcontroller 115 and external devices 190*a*-190*b*, etc.), described above with respect to FIGS. 1-4—is shown comprising hardware elements that can be electrically coupled via a bus 505 (or may otherwise be in communication, as appropriate). The hardware elements may include one or more processors 510, including, without limitation, one or more general-purpose processors and/or one or more special-purpose processors (such as microprocessors, digital signal processing chips, graphics acceleration processors, and/or the like); one or more input devices 515, which can include, without limitation, a mouse, a keyboard, and/or the like; and one or more output devices 520, which can include, without limitation, a display device, a printer, and/or the like.

The computer or hardware system 500 may further include (and/or be in communication with) one or more storage devices 525, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable, and/or the like. Such storage devices may be configured to implement any appropriate data stores, including, without limitation, various file systems, database structures, and/or the like.

The computer or hardware system 500 might also include a communications subsystem 530, which can include, without limitation, a modem, a network card (wireless or wired), an infra-red communication device, a wireless communication device and/or chipset (such as a Bluetooth™ device, an 802.11 device, a WiFi device, a WiMax device, a WWAN device, cellular communication facilities, etc.), and/or the like. The communications subsystem 530 may permit data to be exchanged with a network (such as the network described below, to name one example), with other computer or hardware systems, and/or with any other devices described herein. In many embodiments, the computer or hardware system 500 will further comprise a working memory 535, which can include a RAM or ROM device, as described above.

The computer or hardware system 500 also may comprise software elements, shown as being currently located within the working memory 535, including an operating system 540, device drivers, executable libraries, and/or other code, such as one or more application programs 545, which may comprise computer programs provided by various embodiments (including, without limitation, hypervisors, VMs, and the like), and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be encoded and/or stored on a non-transitory computer readable storage medium, such as the storage device(s) 525 described above. In some cases, the storage medium might be incorporated within a computer system, such as the system 500. In other embodiments, the storage medium might be separate from a computer system (i.e., a removable medium, such as a compact disc, etc.), and/or provided in an installation package, such that the storage medium can be used to program, configure, and/or adapt a general purpose computer with the instructions/code stored thereon. These instructions might take the form of executable code, which is executable by the computer or hardware system 500 and/or might take the form of source and/or installable code, which, upon compilation and/or installation on the computer or hardware system 500 (e.g., using any of a variety of generally available compilers, installation programs, compression/decompression utilities, etc.) then takes the form of executable code.

It will be apparent to those skilled in the art that substantial variations may be made in accordance with particular requirements. For example, customized hardware (such as programmable logic controllers, field-programmable gate arrays, application-specific integrated circuits, and/or the like) might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer or hardware system (such as the computer or hardware system 500) to perform methods in accordance with various embodiments of the invention. According to a set of embodiments, some or all of the procedures of such methods are performed by the computer or hardware system 500 in response to processor 510 executing one or more sequences of one or more instructions (which might be incorporated into the operating system 540 and/or other code, such as an application program 545) contained in the working memory 535. Such instructions may be read into the working memory 535 from another computer readable medium, such as one or more of the storage device(s) 525. Merely by way of example, execution of the sequences of instructions contained in the working memory 535 might cause the processor(s) 510 to perform one or more procedures of the methods described herein.

The terms "machine readable medium" and "computer readable medium," as used herein, refer to any medium that participates in providing data that causes a machine to operate in some fashion. In an embodiment implemented using the computer or hardware system 500, various computer readable media might be involved in providing instructions/code to processor(s) 510 for execution and/or might be used to store and/or carry such instructions/code (e.g., as signals). In many implementations, a computer readable medium is a non-transitory, physical, and/or tangible storage medium. In some embodiments, a computer readable medium may take many forms, including, but not limited to, non-volatile media, volatile media, or the like. Non-volatile media includes, for example, optical and/or magnetic disks, such as the storage device(s) 525. Volatile media includes, without limitation, dynamic memory, such as the working memory 535. In some alternative embodiments, a computer readable medium may take the form of transmission media, which includes, without limitation, coaxial cables, copper wire, and fiber optics, including the wires that comprise the bus 505, as well as the various components of the communication subsystem 530 (and/or the media by which the communications subsystem 530 provides communication with other devices). In an alternative set of embodiments, transmission media can also take the form of waves (including without limitation radio, acoustic, and/or light waves, such as those generated during radio-wave and infra-red data communications).

Common forms of physical and/or tangible computer readable media include, for example, a floppy disk, a flexible disk, a hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read instructions and/or code.

Various forms of computer readable media may be involved in carrying one or more sequences of one or more instructions to the processor(s) 510 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer or hardware system 500. These signals, which might be in the form of electromagnetic signals, acoustic signals, optical signals, and/or the like, are all examples of carrier waves on which instructions can be encoded, in accordance with various embodiments of the invention.

The communications subsystem 530 (and/or components thereof) generally will receive the signals, and the bus 505 then might carry the signals (and/or the data, instructions, etc. carried by the signals) to the working memory 535, from which the processor(s) 505 retrieves and executes the instructions. The instructions received by the working memory 535 may optionally be stored on a storage device 525 either before or after execution by the processor(s) 510.

While particular features and aspects have been described with respect to some embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while particular functionality is ascribed to particular system components, unless the context dictates otherwise, this functionality need not be limited to such and can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—particular features for ease of description and to illustrate some aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A flexible printed circuit board ("PCB")-based mobile sensor platform, comprising:
   at least one body portion;
   a microcontroller disposed on the at least one body portion;
   one or more sensors disposed on the at least one body portion and configured to collect sensor data;

a transceiver disposed on the at least one body portion, the transceiver being configured to receive wireless instructions for the microcontroller to execute and being configured to send the collected sensor data to an external device;

a locomotion system comprising one or more flexible PCB portions and corresponding one or more actuators, each actuator among the one or more actuators communicatively coupled to the microcontroller and configured to cause a corresponding flexible PCB portion among the one or more flexible PCB portions to bend and unbend;

wherein, in response to receiving instructions from the microcontroller, at least one actuator among the one or more actuators causes bending and unbending of corresponding at least one flexible PCB portion among the one or more flexible PCB portions that causes the flexible PCB-based mobile sensor platform to move toward a target location within a first environment, by moving along at least one first direction, and wherein, in response to determining that the flexible PCB-based mobile sensor platform has arrived at the target location, the one or more sensors collect sensor data regarding at least one of the target location, an object located at the target location, or a portion of the object, and the microcontroller sends the collected sensor data to the external device via the transceiver.

2. The flexible PCB-based mobile sensor platform of claim 1, wherein the flexible PCB portion is made of a material comprising at least one of polyimide, polyester, polyethylene terephthalate ("PET"), or polyethylene naphthalate ("PEN").

3. The flexible PCB-based mobile sensor platform of claim 2, wherein the at least one body portion is made of the same material as the flexible PCB portion.

4. The flexible PCB-based mobile sensor platform of claim 1, wherein the one or more sensors comprise at least one of one or more cameras, one or more ultraviolet ("UV") light sensors, one or more infrared ("IR") light sensors, one or more radio frequency ("rf") sensors, one or more miniature cameras, one or more miniature UV light sensors, one or more miniature IR light sensors, one or more miniature rf sensors, one or more gas sensors, one or more air quality sensors, one or more motion sensors, one or more sound sensors, or one or more signal detectors.

5. The flexible PCB-based mobile sensor platform of claim 1, wherein the external device comprises at least one of a smart phone, a mobile phone, a tablet computer, a laptop computer, a desktop computer, a server computer, a wireless access point, a wireless data relay device, a wireless data hub, or a data collection system.

6. The flexible PCB-based mobile sensor platform of claim 1, further comprising at least one power source, the at least one power source comprising at least one of a wired connection to an external power supply, a battery, a wireless induction-based power source, a solar power-based power source, a mechanical energy storage power source, a spring-based mechanical energy storage power source, a piezoelectric-based energy storage power source, or an energy scavenging circuit-based power source.

7. The flexible PCB-based mobile sensor platform of claim 1, wherein:

the one or more flexible PCB portions comprise at least one flexible PCB portion that is folded with at least one fold such that a first portion of a first surface faces a second portion of the first surface;

the one or more actuators comprise at least one actuator disposed on at least one of the first portion or the second portion of the first surface;

actuation of the at least one actuator causes the switch between one of two states, the two states comprising an attraction state between the first and second portions and a repulsion state between the first and second portions; and switching between the attraction state and the repulsion state in a preconfigured mode causes the flexible PCB-based mobile sensor platform to move toward the target location.

8. The flexible PCB-based mobile sensor platform of claim 7, the at least one actuator comprises a magnetic material that is disposed on one of the first portion or the second portion and a spiral PCB coil that is printed on the other of the first portion or the second portion, wherein the attraction state is implemented by energizing the spiral PCB coil in a first current direction causing a magnetic field-based attraction between the spiral PCB coil and the magnetic material, thereby resulting in the first and second portions moving toward each other, wherein the repulsion state is implemented by energizing the spiral PCB coil in a second current direction that is opposite to the first current direction causing a magnetic field-based repulsion between the spiral PCB coil and the magnetic material, thereby resulting in the first and second portions moving away from each other.

9. The flexible PCB-based mobile sensor platform of claim 8, wherein:

the at least one flexible PCB portion is folded with a plurality of folds such that the first portion of the first surface faces the second portion of the first surface and a third portion of the first surface faces a fourth portion of the first surface;

the at least one actuator comprises a first magnetic material that is disposed on one of the first portion or the second portion, a first spiral PCB coil that is printed on the other of the first portion or the second portion, a second magnetic material that is disposed on one of the third portion or the fourth portion, and a second spiral PCB coil that is printed on the other of the third portion or the fourth portion;

the attraction state is implemented by energizing each spiral PCB coil in the first current direction causing a magnetic field-based attraction between each spiral PCB coil and each corresponding magnetic material, thereby resulting in the first and second portions moving toward each other and in the third and fourth portions moving toward each other; and the repulsion state is implemented by energizing each spiral PCB coil in the second current direction that is opposite to the first current direction causing a magnetic field-based repulsion between each spiral PCB coil and each magnetic material, thereby resulting in the first and second portions moving away from each other and in the third and fourth portions moving away from each other.

10. The flexible PCB-based mobile sensor platform of claim 8, wherein:

the at least one flexible PCB portion is folded with a plurality of folds such that the first portion of the first surface faces the second portion of the first surface and a third portion of the first surface faces a fourth portion of the first surface;

the at least one actuator comprises a first magnetic material that is disposed on the first portion, a first spiral PCB coil that is printed on one of the second portion or the third portion, and a second magnetic material that is disposed on the fourth portion;

the attraction state is implemented by energizing the first spiral PCB coil in the first current direction causing a magnetic field-based attraction between the first spiral PCB coil and each of the first and second magnetic materials, thereby resulting in the first and fourth portions moving toward the one of the second portion or the third portion; and the repulsion state is implemented by energizing the first spiral PCB coil in the second current direction that is opposite to the first current direction causing a magnetic field-based repulsion between the first spiral PCB coil and each of the first and second magnetic materials, thereby resulting in the first and fourth portions moving away from the one of the second portion or the third portion.

11. The flexible PCB-based mobile sensor platform of claim 8, wherein:

the at least one flexible PCB portion is folded with a plurality of folds such that the first portion of the first surface faces the second portion of the first surface and a third portion of the first surface faces a fourth portion of the first surface;

the at least one actuator comprises a first spiral PCB coil that is printed on the first portion, a first magnetic material that is disposed on one of the second portion or the third portion, a second spiral PCB coil that is printed on the fourth portion;

the attraction state is implemented by energizing each spiral PCB coil in the first current direction causing a magnetic field-based attraction between each spiral PCB coil and the first magnetic material, thereby resulting in the first and fourth portions moving toward the one of the second portion or the third portion; and the repulsion state is implemented by energizing each spiral PCB coil in the second current direction that is opposite to the first current direction causing a magnetic field-based repulsion between each spiral PCB coil and the first magnetic material, thereby resulting in the first and fourth portions moving away from the one of the second portion or the third portion.

12. The flexible PCB-based mobile sensor platform of claim 7, wherein each of the first and second portions of the first surface comprises a pair of side-by-side actuators that is configured to independently actuate to cause the flexible PCB-based mobile sensor platform to turn to a right-side or a left-side based on differential attraction or repulsion of the side-by-side actuators.

13. The flexible PCB-based mobile sensor platform of claim 1, wherein the at least one target location comprises at least one portion of an optical fiber cable, wherein the flexible PCB-based mobile sensor platform further comprises:

a pair of flexible PCB front leg portions and a pair of flexible PCB rear leg portions, each pair extending from either side of the at least one body portion, each leg portion comprising a foot portion that is made of a material that is soft or deformable and that provides traction against an outer cladding of the optical fiber cable;

a first set of lateral actuators disposed on the pair of flexible PCB front leg portions that, when actuated, are configured to switch between an attraction state between the front leg portions and a repulsion state between the front leg portions;

a second set of lateral actuators disposed on the pair of flexible PCB rear leg portions that, when actuated, are configured to switch between an attraction state between the rear leg portions and a repulsion state between the rear leg portions;

wherein actuation of the first and second sets of lateral actuators are coordinated with actuation of the at least one actuator of the locomotion system, such that forward motion of the flexible PCB-based mobile sensor platform is achieved by repeating the following sequence:

the second set of lateral actuators being set to the attraction state such that the foot portions of the pair of flexible PCB rear leg portions are in contact with the optical fiber cable;

the first set of lateral actuators being set to the repulsion state;

the at least one actuator of the locomotion system causing unbending of the corresponding at least one flexible PCB portion, resulting in the pair of flexible PCB front leg portions moving forward along the optical fiber cable relative to the pair of flexible PCB rear leg portions;

the first set of lateral actuators being set to the attraction state such that the foot portions of the pair of flexible PCB front leg portions are set to contact with the optical fiber cable;

the second set of lateral actuators being set to the repulsion state; and the at least one actuator of the locomotion system causing bending of corresponding flexible PCB portions, resulting in the pair of flexible PCB rear leg portions moving forward along the optical fiber cable relative to the pair of flexible PCB front leg portions.

14. The flexible PCB-based mobile sensor platform of claim 13, wherein:

the target location comprises one of a damaged portion of the optical fiber cable, a portion of the optical fiber cable with at least one exposed cladding layer, or a fiber optic connector disposed at an end of the optical fiber cable; and the one or more sensors collect sensor data regarding at least one of the target location, state of the optical fiber cable, state of the fiber optic connector, or optical characteristics of the optical fiber cable.

15. The flexible PCB-based mobile sensor platform of claim 14, further comprising one or more light emitting diode ("LED") indicator lights communicatively coupled to the microcontroller, wherein the one or more LED indicator lights are indicative of one or more of a functioning optical fiber cable, a damaged optical fiber cable, or a damaged fiber optic connector.

16. The flexible PCB-based mobile sensor platform of claim 13, further comprising a cleaning surface extending from the at least one body portion, the cleaning surface being configured to drag along, and being configured to clean, the at least one portion of the optical fiber cable as the flexible PCB-based mobile sensor platform is moved along the optical fiber cable.

17. The flexible PCB-based mobile sensor platform of claim 1, wherein the first environment comprises one of an agricultural location, a mining location, a hazardous location, a rubble-strewn search and rescue location, or a confined duct or piping, wherein the flexible PCB-based mobile sensor platform further comprises:

a pair of flexible PCB front leg portions and a pair of flexible PCB rear leg portions, each pair extending from either side of the at least one body portion, each leg portion comprising a foot portion that is made of a material that provides traction against one or more surfaces in the first environment;
wherein forward motion of the flexible PCB-based mobile sensor platform is achieved by repeating the following sequence:
the at least one actuator of the locomotion system causing unbending of the corresponding at least one flexible PCB portion, resulting in the pair of flexible PCB front leg portions moving forward along at least one surface in the first environment relative to the pair of flexible PCB rear leg portions; and
the at least one actuator of the locomotion system causing bending of corresponding flexible PCB portions, resulting in the pair of flexible PCB rear leg portions moving forward along the at least one surface in the first environment relative to the pair of flexible PCB front leg portions.

18. The flexible PCB-based mobile sensor platform of claim 17, wherein backward motion of the flexible PCB-based mobile sensor platform is achieved by repeating the following sequence:
the at least one actuator of the locomotion system causing unbending of the corresponding at least one flexible PCB portion, resulting in the pair of flexible PCB rear leg portions moving backward along the at least one surface in the first environment relative to the pair of flexible PCB front leg portions; and
the at least one actuator of the locomotion system causing bending of corresponding flexible PCB portions, resulting in the pair of flexible PCB front leg portions moving backward along the at least one surface in the first environment relative to the pair of flexible PCB rear leg portions.

19. A method for controlling operation of a flexible printed circuit board ("PCB")-based mobile sensor platform, the flexible PCB-based mobile sensor platform comprising at least one body portion, a microcontroller disposed on the at least one body portion, one or more sensors disposed on the at least one body portion and configured to collect sensor data, a transceiver disposed on the at least one body portion, the transceiver being configured to receive wireless instructions for the microcontroller to execute and being configured to send the collected sensor data to an external device, and a locomotion system comprising one or more flexible PCB portions and corresponding one or more actuators, each actuator among the one or more actuators communicatively coupled to the microcontroller and configured to cause a corresponding flexible PCB portion among the one or more flexible PCB portions to bend and unbend, wherein the method comprises:
sending, using the microcontroller, instructions to at least one actuator among the one or more actuators;
in response to receiving the instructions, causing, using the at least one actuator, bending and unbending of corresponding at least one flexible PCB portion among the one or more flexible PCB portions that causes the flexible PCB-based mobile sensor platform to move toward a target location within a first environment, by moving along at least one first direction; and
in response to determining that the flexible PCB-based mobile sensor platform has arrived at the target location, collecting, using the one or more sensors, sensor data regarding at least one of the target location, an object located at the target location, or a portion of the object, and sending, using the microcontroller, the collected sensor data to the external device via the transceiver.

20. The method of claim 19, wherein the flexible PCB-based mobile sensor platform further comprises a pair of flexible PCB front leg portions and a pair of flexible PCB rear leg portions, each pair extending from either side of the at least one body portion, each leg portion comprising a foot portion that is made of a material that provides traction against one or more surfaces in the first environment,
wherein forward motion of the flexible PCB-based mobile sensor platform is achieved by repeating the following sequence:
causing, using the at least one actuator of the locomotion system, unbending of the corresponding at least one flexible PCB portion, resulting in the pair of flexible PCB front leg portions moving forward along at least one surface in the first environment relative to the pair of flexible PCB rear leg portions; and
causing, using the at least one actuator of the locomotion system, bending of corresponding flexible PCB portions, resulting in the pair of flexible PCB rear leg portions moving forward along the at least one surface in the first environment relative to the pair of flexible PCB front leg portions;
wherein backward motion of the flexible PCB-based mobile sensor platform is achieved by repeating the following sequence:
causing, using the at least one actuator of the locomotion system, unbending of the corresponding at least one flexible PCB portion, resulting in the pair of flexible PCB rear leg portions moving backward along the at least one surface in the first environment relative to the pair of flexible PCB front leg portions; and
causing, using the at least one actuator of the locomotion system, bending of corresponding flexible PCB portions, resulting in the pair of flexible PCB front leg portions moving backward along the at least one surface in the first environment relative to the pair of flexible PCB rear leg portions; and
wherein each of first and second portions of the first surface comprises a pair of side-by-side actuators that is configured to independently actuate to cause the flexible PCB-based mobile sensor platform to turn to a right-side or a left-side based on differential attraction or repulsion of the side-by-side actuators.

* * * * *